(12) United States Patent
Ishizu et al.

(10) Patent No.: US 10,573,374 B2
(45) Date of Patent: Feb. 25, 2020

(54) STORAGE DEVICE AND DRIVING METHOD THEREOF FOR GAIN CELL INCLUDING CANCEL CIRCUIT

(71) Applicant: Semiconductor Energy Laboratory Co., Ltd., Atsugi-shi, Kanagawa-ken (JP)

(72) Inventors: Takahiko Ishizu, Atsugi (JP); Shuhei Nagatsuka, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/784,495

(22) Filed: Oct. 16, 2017

(65) Prior Publication Data

US 2018/0114578 A1   Apr. 26, 2018

(30) Foreign Application Priority Data

Oct. 20, 2016   (JP) ................................. 2016-206300

(51) Int. Cl.
*G11C 11/40* (2006.01)
*G11C 11/4094* (2006.01)
(Continued)

(52) U.S. Cl.
CPC ............ *G11C 11/4094* (2013.01); *G11C 7/10* (2013.01); *G11C 7/1075* (2013.01);
(Continued)

(58) Field of Classification Search
CPC ..... G11C 11/4099; G11C 11/405; G11C 7/10; G11C 7/1075; H01L 27/108
See application file for complete search history.

(56) References Cited

U.S. PATENT DOCUMENTS 6,314,017 B1*  11/2001  Emori ................... G11C 11/405
                                                      257/296
6,512,714 B2*   1/2003  Hanzawa ................. G11C 7/14
                                                      365/185.21
(Continued)

FOREIGN PATENT DOCUMENTS

JP      2001-053167 A     2/2001
JP      2001-195885 A     7/2001
(Continued)

OTHER PUBLICATIONS

Inoue.H et al., "Nonvolatile Memory With Extremely Low-Leakage Indium-Gallium-Zinc-Oxide Thin-Film Transistor", IEEE Journal of Solid-State Circuits, Sep. 1, 2012, vol. 47, No. 9, pp. 2258-2265.
(Continued)

*Primary Examiner* — Vanthu T Nguyen
(74) *Attorney, Agent, or Firm* — Robinson Intellectual Property Law Office; Eric J. Robinson

(57) ABSTRACT

A data reading error is reduced. A memory cell array in a storage device includes a write word line, a read word line, a write bit line, a read bit line, a source line, and a gain cell. For example, a read transistor in the gain cell can include a metal oxide in a channel formation region. A cancel circuit is electrically connected to the read bit line. The cancel circuit has a function of supplying, to the read bit line, current for canceling leakage current supplied to the read bit line from the gain cell in a non-selected state. In read operation, a potential change of the read bit line due to leakage current is compensated for by the current from the cancel circuit, so that a data reading error is reduced.

19 Claims, 26 Drawing Sheets

(51) Int. Cl.
- *G11C 11/4099* (2006.01)
- *G11C 7/10* (2006.01)
- *G11C 11/405* (2006.01)
- *H01L 27/108* (2006.01)
- *G11C 16/04* (2006.01)
- *G11C 16/08* (2006.01)
- *G11C 16/28* (2006.01)

(52) U.S. Cl.
CPC ........ *G11C 11/405* (2013.01); *G11C 11/4099* (2013.01); *G11C 16/0483* (2013.01); *G11C 16/08* (2013.01); *G11C 16/28* (2013.01); *H01L 27/108* (2013.01)

(56) References Cited

U.S. PATENT DOCUMENTS

| | | | | |
|---|---|---|---|---|
| 6,982,897 | B2* | 1/2006 | Luk | G11C 11/405 |
| | | | | 257/E27.084 |
| 7,085,184 | B1 | 8/2006 | Walther et al. | |
| 7,466,617 | B2* | 12/2008 | Luk | G11C 7/12 |
| | | | | 365/205 |
| 8,395,960 | B2* | 3/2013 | Lum | G11C 11/413 |
| | | | | 365/189.08 |
| 8,675,403 | B2* | 3/2014 | Luk | G11C 11/404 |
| | | | | 365/175 |
| 8,848,464 | B2 | 9/2014 | Sekine et al. | |
| 8,896,042 | B2 | 11/2014 | Yamazaki et al. | |
| 9,082,465 | B2* | 7/2015 | Ganesan | G11C 7/065 |
| 9,373,389 | B2* | 6/2016 | Yamamoto | G11C 8/16 |
| 9,589,611 | B2 | 3/2017 | Ishizu et al. | |
| 9,818,474 | B2* | 11/2017 | Hsu | G05F 3/262 |
| 2001/0007537 | A1 | 7/2001 | Agawa et al. | |
| 2003/0063511 | A1 | 4/2003 | Hsu et al. | |
| 2005/0280000 | A1 | 12/2005 | Ishii et al. | |
| 2006/0050548 | A1 | 3/2006 | Oh et al. | |
| 2008/0298155 | A1 | 12/2008 | Miyako | |
| 2011/0089417 | A1 | 4/2011 | Yamazaki et al. | |
| 2011/0101351 | A1 | 5/2011 | Yamazaki | |
| 2014/0355339 | A1 | 12/2014 | Inoue et al. | |
| 2018/0075900 | A1 | 3/2018 | Ishizu et al. | |

FOREIGN PATENT DOCUMENTS

| | | |
|---|---|---|
| JP | 2006-012878 A | 1/2006 |
| JP | 2006-079812 A | 3/2006 |
| JP | 2008-293619 A | 12/2008 |
| JP | 2011-119675 A | 6/2011 |
| JP | 2015-008030 A | 1/2015 |
| KR | 2001-0070449 A | 7/2001 |
| KR | 2006-0022009 A | 3/2006 |
| KR | 2014-0141472 A | 12/2014 |

OTHER PUBLICATIONS

International Search Report (Application No. PCT/IB2017/056340) dated Jan. 23, 2018.

Written Opinion (Application No. PCT/IB2017/056340) dated Jan. 23, 2018.

\* cited by examiner

[ NOSRAM 100R ]

[ NOSRAM 100 ]

STORAGE DEVICE AND DRIVING METHOD THEREOF FOR GAIN CELL INCLUDING CANCEL CIRCUIT

TECHNICAL FIELD

One embodiment of the present invention disclosed in the specification, the drawings, and the claims (hereinafter referred to as "this specification and the like") relates to a storage device, a driving method thereof, a usage method thereof, a manufacturing method thereof, and the like. Note that one embodiment of the present invention is not limited to the above technical fields.

BACKGROUND ART

In a general dynamic random access memory (DRAM), a memory cell includes one transistor (1T) and one capacitor (1C). Such a 1T1C DRAM is a memory capable of retaining data by accumulating electric charge in a capacitor and thus has no limit on endurance in principle. As a high-capacity memory device, the DRAM is incorporated into a number of electronic devices because of writing and reading at high speed and a small number of elements in memory cells, which facilitates high integration. The 1T1C DRAM performs data reading in such a manner that electric charge accumulated in the capacitor is released to a bit line and a potential change of the bit line is measured; therefore, the capacitance of the capacitor needs to be kept at a certain value or more. As a result, miniaturization of the memory cell makes it more and more difficult to keep required capacitance.

A gain cell including two or three transistors has been proposed (e.g., Patent Documents 1 and 2). In the gain cell, the amount of accumulated electric charge can be amplified by a read transistor and the amplified electric charge can be supplied to a bit line; therefore, it is possible to reduce the capacitance of a capacitor.

A transistor including a metal oxide in a channel formation region (hereinafter such a transistor is referred to as a metal oxide semiconductor transistor or an OS transistor in some cases) is known. For example, a storage device in which a write transistor of a gain cell is an OS transistor has been disclosed in each of Patent Document 3 and Non-Patent Document 1.

In this specification and the like, a memory including an OS transistor in a memory cell, as described in Patent Document 3, is referred to as an OS memory. As in Non-Patent Document 1, a gain-cell DRAM in which a write transistor is an OS transistor is referred to as "NOSRAM" (registered trademark). "NOSRAM" stands for nonvolatile oxide semiconductor RAM.

REFERENCE

Patent Documents

Patent Document 1: Japanese Published Patent Application No. 2001-053167
Patent Document 2: Japanese Published Patent Application No. 2006-012878
Patent Document 3: Japanese Published Patent Application No. 2011-119675

Non-Patent Document

Non-Patent Document 1: H. Inoue et al., "Nonvolatile Memory With Extremely Low-Leakage Indium-Gallium-Zinc-Oxide Thin-Film Transistor," *IEEE J. Solid-State Circuits*, September 2012, vol. 47, no. 9, pp. 2258-2265.

DISCLOSURE OF INVENTION

Objects of one embodiment of the present invention are to improve a noise margin and to reduce incorrect data reading.

One embodiment of the present invention does not necessarily achieve all the objects described above. The description of a plurality of objects does not disturb the existence of each object. Other objects will be apparent from the description of this specification and the like, and such objects could be objects of one embodiment of the present invention.

(1) A storage device in one embodiment of the present invention includes a gain cell, a cancel circuit, a write word line, a read word line, a write bit line, and a read bit line. The gain cell includes a write transistor and a read transistor. The gain cell is electrically connected to the write word line, the read word line, the write bit line, and the read bit line. The cancel circuit has a function of supplying, to the read bit line, current for canceling leakage current supplied to the read bit line from the gain cell in a non-selected state.

(2) In the embodiment (1), the gain cell includes a selection transistor.

(3) In the embodiment (1) or (2), a channel formation region of the write transistor includes a metal oxide.

In this specification and the like, ordinal numbers such as "first," "second," and "third" are used to avoid confusion among components in some cases, and do not limit the number or order of components.

In this specification and the like, explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Each of X and Y denotes an object (e.g., a device, an element, a circuit, a wiring, an electrode, a terminal, a conductive film, or a layer).

A transistor is an element having three terminals: a gate, a source, and a drain. The gate is a terminal that functions as a control terminal for controlling the on/off state of the transistor. Depending on the type of the transistor or levels of potentials applied to the terminals, one of two input/output terminals functions as a source and the other functions as a drain. Therefore, the terms "source" and "drain" can be interchanged with each other in this specification and the like. In this specification and the like, two terminals except a gate are referred to as a first terminal and a second terminal in some cases.

A node can be referred to as a terminal, a wiring, an electrode, a conductive layer, a conductor, an impurity region, or the like depending on a circuit structure, a device structure, and the like. Furthermore, a terminal, a wiring, or the like can also be referred to as a node.

Voltage refers to a potential difference between given potential and reference potential (e.g., ground potential or source potential) in many cases. Thus, voltage can also be referred to as potential. Note that potential has a relative value. Accordingly, the ground potential does not necessarily mean 0 V.

In this specification and the like, the terms "film" and "layer" can be interchanged with each other depending on circumstances or conditions. For example, the term "conductive layer" can be changed into the term "conductive film" in some cases. The term "insulating film" can be changed into the term "insulating layer" in some cases, for example.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit and a chip including an integrated circuit are examples of semiconductor devices. Moreover, a storage device, a display device, a light-emitting device, a lighting device, an electronic device, and the like themselves might be semiconductor devices, or might each include a semiconductor device.

In this specification and the like, a metal oxide means an oxide of metal in a broad sense. Metal oxides are classified into an oxide insulator, an oxide conductor (including a transparent oxide conductor), an oxide semiconductor, and the like. For example, a metal oxide used in a channel formation region of a transistor is called an oxide semiconductor in some cases.

In this specification and the like, a metal oxide including nitrogen is in the category of a metal oxide used in a channel formation region of a transistor, unless otherwise specified. Note that a metal oxide including nitrogen may be called a metal oxynitride.

According to one embodiment of the present invention, a noise margin can be improved and incorrect data reading can be reduced.

In one embodiment of the present invention, there is no need to obtain all the effects described above. The description of a plurality of effects does not disturb the existence of other effects. In one embodiment of the present invention, other objects, effects, and novel features will be apparent from the description of the specification and the drawings.

BEST MODE FOR CARRYING OUT THE INVENTION

Figure 1A:
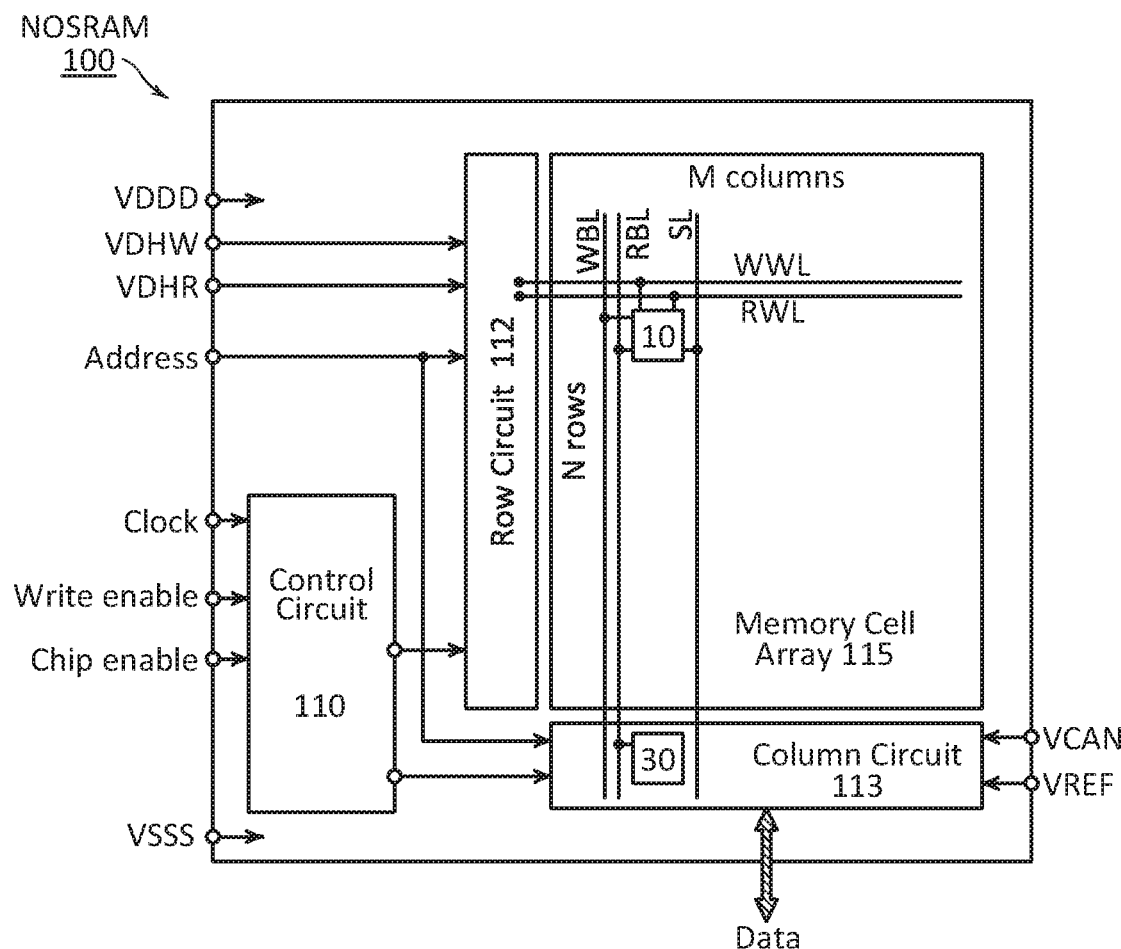
FIG. 1A is a block diagram illustrating a structure example of a NOSRAM.

Embodiments of the present invention will be described below. Note that one embodiment of the present invention is not limited to the following description. It will be readily appreciated by those skilled in the art that modes and details of the present invention can be modified in various ways without departing from the spirit and scope of the present invention. One embodiment of the present invention therefore should not be construed as being limited to the following description of the embodiments.

Any of the embodiments described below can be combined as appropriate. In addition, in the case where a plurality of structure examples (including a manufacturing method example, an operating method example, and the like) are given in one embodiment, some of the structure examples can be combined as appropriate, and any of the structure examples can be combined with one or more structure examples described in the other embodiments.

The same components, components having similar functions, components formed using the same material, components formed at the same time, and the like in the drawings are denoted by the same reference numerals, and the description thereof is not repeated in some cases.

In the drawings, the size, the layer thickness, the region, and the like are exaggerated for clarity in some cases. Thus, embodiments of the present invention are not limited to such scales. The drawings are schematic views showing ideal examples, and embodiments of the present invention are not limited to shapes or values shown in the drawings. For example, the following can be included: variation in signal, voltage, or current due to noise or difference in timing.

In this specification, terms for describing arrangement, such as "over," "above," "under," and "below" are used for convenience for describing the positional relationship between components with reference to drawings in some cases. Furthermore, the positional relationship between components is changed as appropriate in accordance with a direction in which each component is described. Thus, there is no limitation on terms used in this specification, and description can be made appropriately depending on the situation.

Embodiment 1

In this embodiment, a storage device including a gain-cell memory cell is described. A NOSRAM is described here as an example of such a storage device.

<NOSRAM 100>

FIG. 1A is a block diagram illustrating a structure example of a NOSRAM. A NOSRAM 100 includes a control circuit 110, a row circuit 112, a column circuit 113, and a memory cell array 115. Potentials VDDD, VSSS, VDHW, VDHR, VCAN, and VREF, a clock signal, an address signal, a chip enable signal, and a write enable signal are input from the outside to the NOSRAM 100.

The control circuit 110 has a function of controlling the entire operation of the NOSRAM 100. For example, the control circuit 110 performs logical operation of the chip enable signal and the write enable signal and determines whether access from the outside is write access or read access.

The row circuit 112 has a function of selecting a word line in a row specified by the address signal. The column circuit 113 has a function of writing and reading data to and from a bit line in a column specified by the address signal.

Figure 1B:
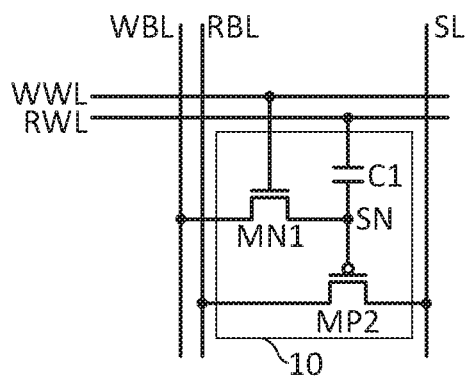
FIGS. 1B and 1C are circuit diagrams each illustrating a structure example of a cell.

The memory cell array 115 includes cells (also referred to as memory cells) 10, word lines WWL and RWL, bit lines WBL and RBL, and a source line SL. The word lines WWL and RWL are a write word line and a read word line, respectively. The bit lines WBL and RBL are a write bit line and a read bit line, respectively. The word lines WWL and RWL are electrically connected to the row circuit 112. The bit lines WBL and RBL and the source line SL are electrically connected to the column circuit 113. FIG. 1B illustrates a structure example of the cell 10.

The cell 10 is a 2T1C gain cell. The cell 10 includes a node SN, transistors MN1 and MP2, and a capacitor C1. The transistors MN1 and MP2 are a write transistor and a read transistor, respectively. The capacitor C1 is a storage capacitor for holding the voltage of the node SN.

Here, the transistor MN1 is an OS transistor. There is no particular limitation on the type of the transistor MP2. A Si transistor is typically used as the transistor MP2. The cell 10 can retain data for a long time because the write transistor MN1 is an OS transistor. Compared with a gain-cell DRAM including a Si transistor, the retention time of the NOSRAM 100 can be much increased. Therefore, the frequency of refresh operation can be reduced, so that power needed for the refresh operation can be reduced.

A metal oxide semiconductor has a bandgap of higher than or equal to 2.5 eV or higher than or equal to 3.0 eV; thus, an OS transistor has low leakage current due to thermal excitation and extremely low off-state current. The off-state current of the OS transistor that is normalized by channel width can be reduced to a range of approximately a few yoctoamperes per micrometer to a few zeptoamperes per micrometer. Thus, when the OS transistor is used as the write transistor, leakage of electric charge from the capacitor C1 can be suppressed, so that the retention time of the cell 10 can be increased. For example, the retention time at 85° C. can be 1 or 10 years.

Examples of a metal oxide that can be used in a channel formation region include Zn oxide, Zn—Sn oxide, Ga—Sn oxide, In—Ga oxide, In—Zn oxide, and In-M-Zn oxide (M is Ti, Ga, Y, Zr, La, Ce, Nd, Sn, or Hf). In addition, an oxide containing indium and zinc may contain one or more kinds of elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

Figure 1C:
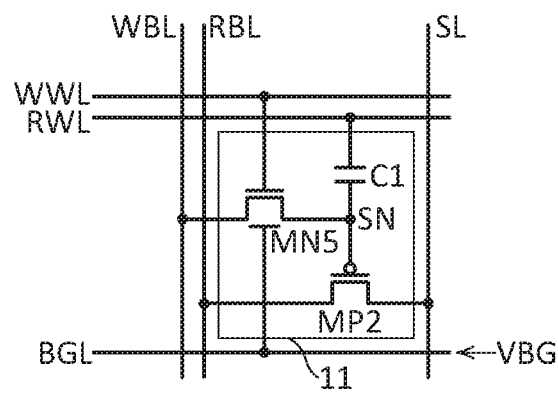

An OS transistor with a back gate can be used as a read transistor of a cell. FIG. 1C illustrates a cell with such a structure. A cell 11 in FIG. 1C is a modification example of the cell 10, which includes a transistor MN5 with a back gate instead of the transistor MN1. The back gate of the transistor MN5 is electrically connected to a wiring BGL. Potential VBG is input to the wiring BGL. For example, the potential VBG positively shifts the threshold voltage of the transistor MN5.

Alternatively, a driver circuit for driving the wiring BGL may be provided in the row circuit 112 to change the potential of the wiring BGL depending on the operation of the NOSRAM 100. Alternatively, the back gate of the transistor MN5 may be electrically connected to any of a gate, a source, and a drain of the transistor MN5.

The row circuit 112 has a function of selecting the word lines WWL and RWL in a row specified by the address signal. The column circuit 113 has a function of writing and reading data to and from the bit lines WBL and RBL in a column specified by the address signal. The column circuit 113 includes a cancel circuit 30. The cancel circuit 30 has a function of compensating for a potential change of the bit line RBL due to leakage current generated in the cell 10 in a non-selected state.

<Memory Cell Array and Column Circuit>

Figure 2:
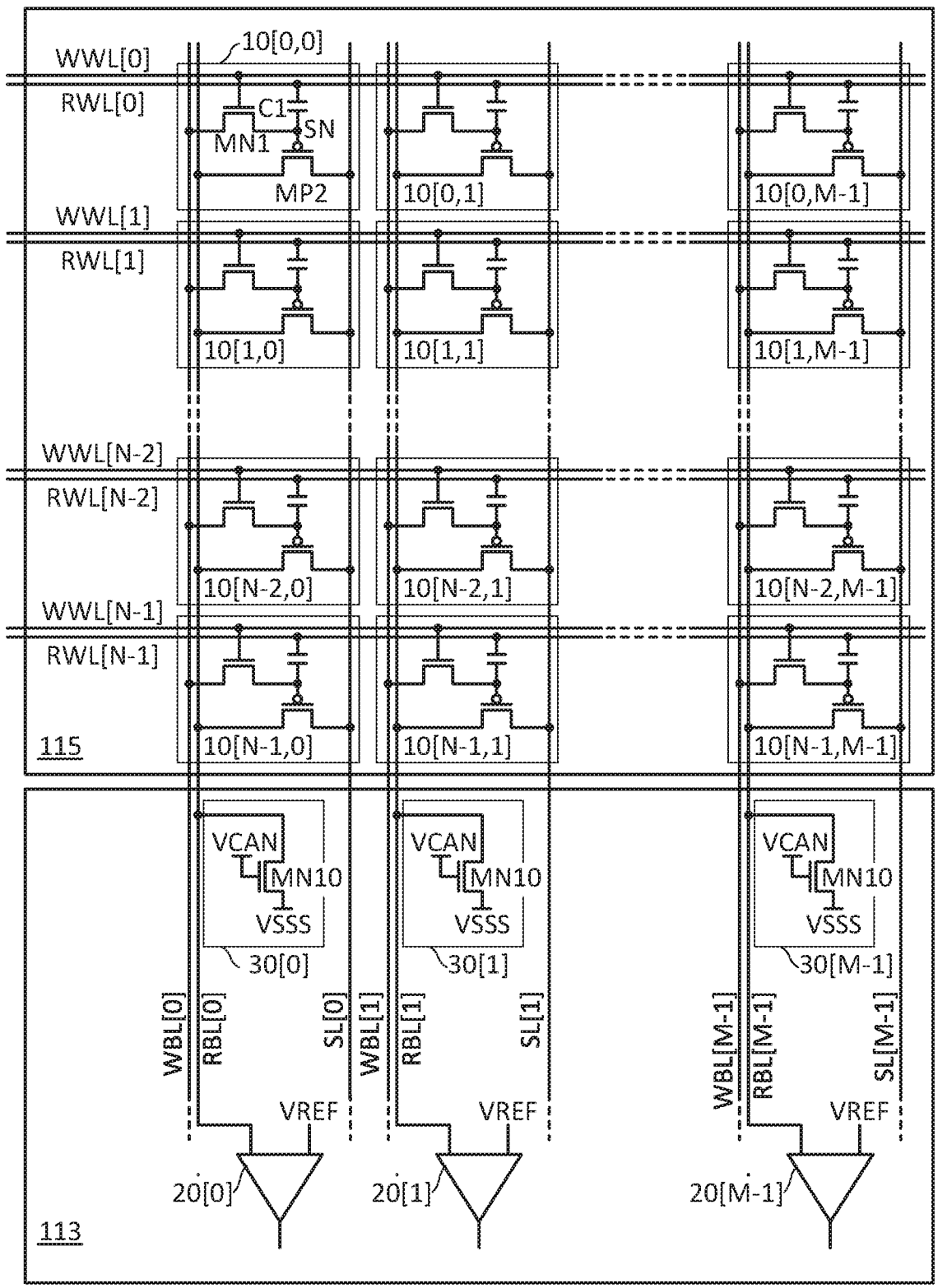
FIG. 2 is a circuit diagram illustrating a structure example of a memory cell array and a column circuit.

Structure examples of the memory cell array 115 and the column circuit 113 are described with reference to FIG. 2. Note that FIG. 2 illustrates some elements included in the column circuit 113.

The cells 10 are arranged in a matrix of N rows and M columns (N and M are each an integer greater than 0). The word lines WWL and RWL, the bit lines WBL and RBL, and the source line SL are provided in the memory cell array 115 in accordance with the arrangement of the cells 10.

Note that in this specification and the like, each of the row number and the column number is counted from not 1 but 0. For example, a bit line RBL[0] represents a read bit line in a 0-th row. A cell 10[0,1] represents a cell 10 in the 0-th row and a first column.

In this specification, when any one of the bit lines needs to be specified among a plurality of bit lines RBL, the one bit line is referred to as a bit line RBL[0], for example. In addition, "the bit line RBL" represents a given bit line RBL. The same applies to other elements.

The column circuit 113 includes a read circuit 20 and the cancel circuit 30 in each column.

The bit line RBL and a power supply line for supplying the potential VREF are electrically connected to the read circuit 20. The potential VREF is read judge potential. The read circuit 20 compares the potential of the bit line RBL and the potential VREF and outputs potential based on a comparison result. For example, VDDD/2 is used as the potential VREF. A sense amplifier (typically a latch sense amplifier), a differential amplifier, or the like can be used for the read circuit 20.

The cancel circuit 30 includes a transistor MN10. A gate of the transistor MN10 is electrically connected to a power supply line for supplying the potential VCAN. A first terminal of the transistor MN10 is electrically connected to the bit line RBL. A second terminal of the transistor MN10 is electrically connected to a power supply line for supplying the potential VSSS. The potential VCAN adjusts the amount of source-drain current (hereinafter referred to as drain current) of the transistor MN10.

<Operation Example>

Figure 3:
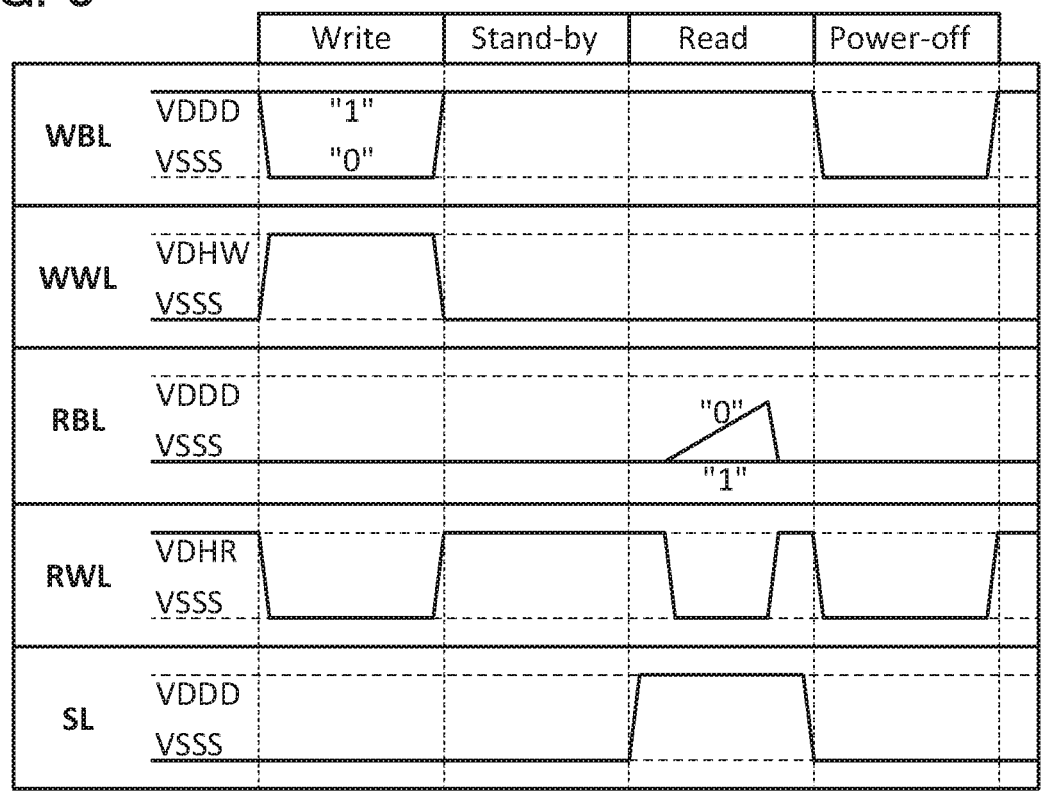
FIG. 3 is a timing chart illustrating an operation example of a NOSRAM.

An operation example of the NOSRAM 100 is described with reference to FIG. 3. FIG. 3 is a timing chart illustrating the operation example of the NOSRAM 100. The potential VDDD is high-level power supply potential and represents data "1." The potential VSSS is low-level power supply potential and represents data "0." The potential VDHW is high-level potential of the word line WWL. The potential VDHR is high-level potential of the word line RWL.

<Power-Off>

In a power-off state, the potential of wirings such as the bit line WBL is VSSS.

<Standby>

When power is on and the chip enable signal is "L" (low level), the NOSRAM 100 is in a standby state. The word line WWL is "L." The word lines RWL is "H" (high level). The transistors MN1 and MP2 of the cell 10 are off.

<Writing>

When the chip enable signal "H" and the write enable signal "H" are input, the NOSRAM 100 performs write operation. The word lines WWL and RWL in a row selected by the row circuit 112 become "H" and "L," respectively. Potential based on data is input to the bit line WBL selected by the column circuit 113. The potential of the node SN in the selected cell 10 becomes VDDD when data "1" is written, and becomes VSSS when data "0" is written.

<Reading>

When the chip enable signal "H" and the write enable signal "L" are input, the NOSRAM 100 performs read operation. The column circuit 113 precharges the bit line RBL to the potential VSSS, and then sets the source line SL to "H." Then, the word line RWL in the row selected by the row circuit 112 becomes "L." When the cell 10 in the selected row retains data "0," the potential VSSS is input to a gate of the transistor MP2; thus, a large amount of source-drain current flows to the transistor MP2. Consequently, the bit line RBL is charged promptly and the potential of the bit line RBL is increased. When the cell 10 in the selected row retains data "1," the potential VDDD is input to the gate of the transistor MP2; thus, drain current hardly flows to the transistor MP2. Consequently, the potential of the bit line RBL is kept at precharge potential (VSSS).

The read circuit 20 is activated while the word line RWL is selected. The activated read circuit 20 judges whether the potential of the bit line RBL corresponds to data "0" or "1" on the basis of the potential VREF, and outputs a signal having potential based on a judgment result.

However, while the word line RWL is selected, leakage current flows from the unselected cell 10 to the bit line RBL; thus, the potential of the bit line RBL contains a component caused by leakage current of the unselected cell 10. Consequently, there is a possibility of incorrect data detection by the read circuit 20.

An object of this embodiment is to reduce a data reading error caused by leakage current of an unselected cell. This object is achieved by providing the cancel circuit 30 in the column circuit 113 of the NOSRAM 100.

The function, effect, and the like of the cancel circuit 30 are described below with reference to FIGS. 4A and 4B and FIGS. 5A to 5C. Here, the function, effect, and the like of the cancel circuit 30 are described by comparison between the NOSRAM 100 in this embodiment and a NOSRAM that does not include the cancel circuit 30 as a comparison example (hereinafter this NOSRAM is referred to as a NOSRAM 100R).

Figure 4A:
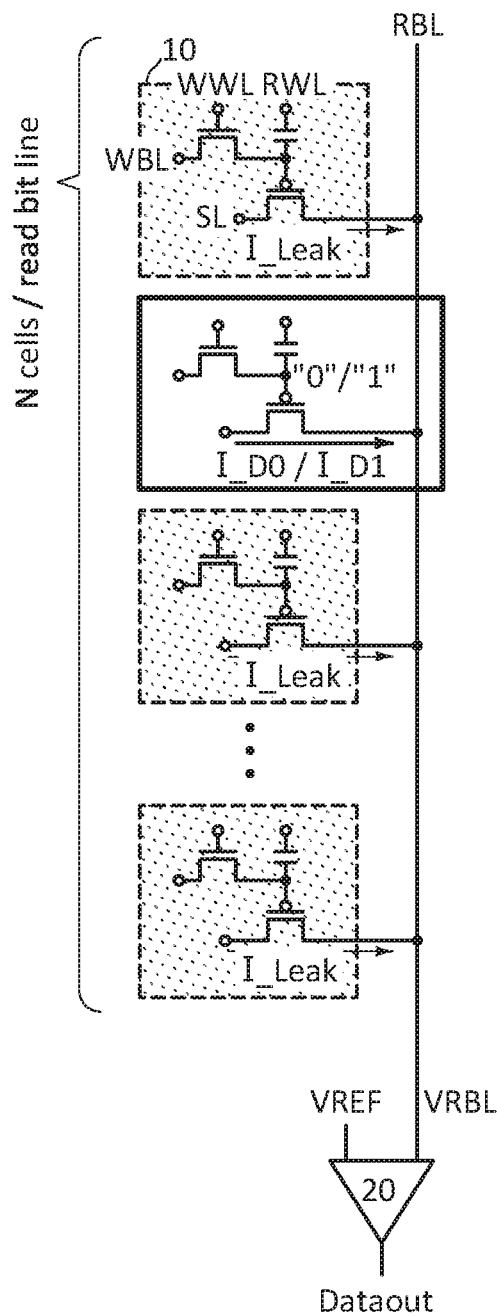
FIG. 4A illustrates an example of a method for detecting data read by a bit line in a NOSRAM in a comparison example.
Figure 4B:
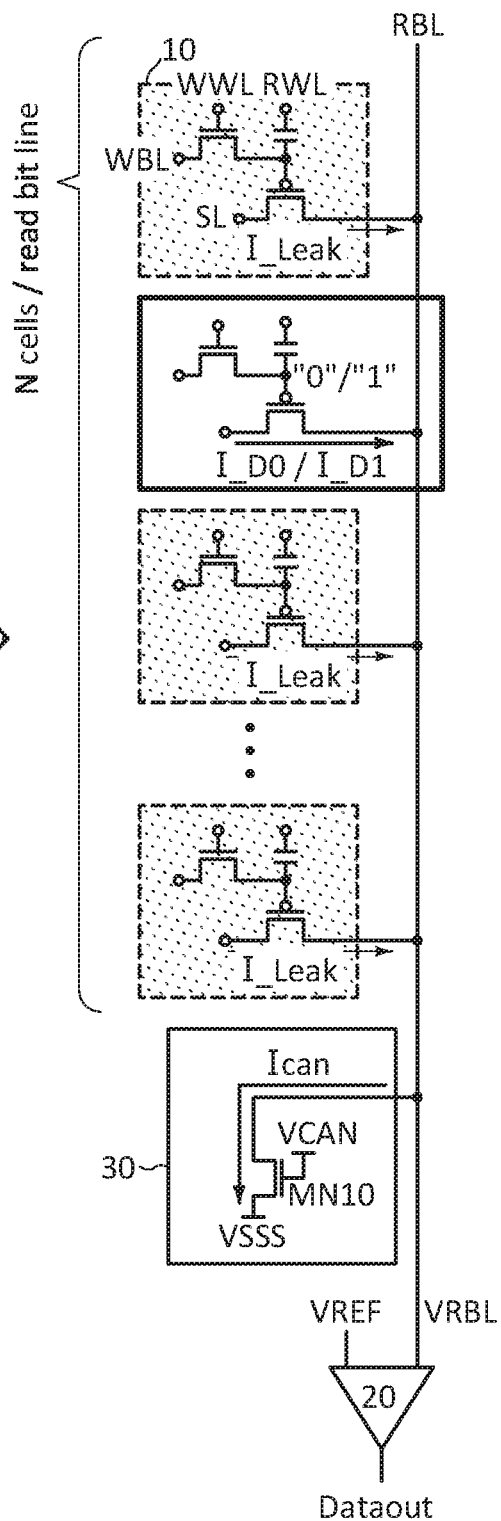
FIG. 4B illustrates an example of a method for detecting data read by a bit line in the NOSRAM in FIG. 1A.

FIGS. 4A and 4B each illustrate an example of a method for detecting data read by the bit line RBL. FIG. 4A illustrates the NOSRAM 100R, and FIG. 4B illustrates the NOSRAM 100.

FIG. 4A illustrates the case where one cell 10 is selected and other N-1 cells 10 are unselected. In the selected cell 10, current based on retained data ("0" or "1") flows from the source line SL to the bit line RBL. Here, current flowing between the selected cell 10 that retains the data "0" and the bit line RBL is referred to as I_D0, and current flowing between the selected cell 10 that retains the data "1" and the bit line RBL is referred to as I_D1.

In the N-1 unselected cells 10, leakage current of the transistor MP2 (hereinafter this leakage current is referred to as current I_Leak) flows between the source line SL and the bit line RBL. Thus, while the one cell 10 is selected, the current I_Leak flows from the N-1 unselected cells 10 to the bit line RBL.

Figure 5A:
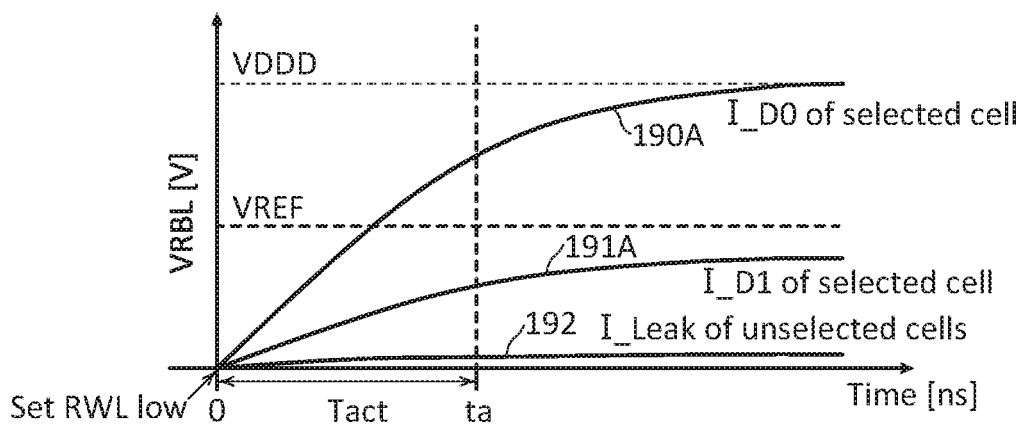
FIGS. 5A to 5C each illustrate an example of a method for detecting data read by a bit line.

FIG. 5A schematically shows a change in potential VRBL of the bit line RBL from the time when the word line RWL is set to "L" in the NOSRAMs 100R and 100. Curves 190A and 191A show potential changes due to the currents I_D0 and I_D1 of the selected cell 10. A curve 192 shows a potential change due to the current I_Leak flowing from the N-1 unselected cells 10. Note that since FIG. 5A illustrates the components of the potential VRBL for different currents flowing to the bit line RBL, the curves 190A and 191A do not include the increase in the potential VRBL due to the current I_Leak.

The read circuit 20 judges whether data read from the selected cell 10 is data "0" or "1" from the magnitude relationship between the potential VREF and the potential VRBL at time ta. In the example of FIG. 4A, the read circuit 20 outputs data "0" when the potential VRBL is higher than the potential VREF, and the read circuit 20 outputs data "1" when the potential VRBL is lower than the potential VREF.

The amount of the current I_Leak is increased due to miniaturization of the transistors included in the cell 10. As the number of cells per bit line RBL becomes larger, the total amount of the current I_Leak supplied to the bit line RBL is increased. In order to reduce cost per bit of the NOSRAM 100, miniaturization of the transistors and an increase in the number of cells per bit line RBL are needed. Thus, the influence of the current I_Leak of the unselected cell 10 on the potential VRBL in read operation cannot be ignored.

As represented by the curve 192, the bit line RBL is charged slowly by the current I_Leak supplied from the unselected cell 10. Thus, while the word line RBL is selected, the bit line RBL is charged not only by the current I_D0 (or I_D1) supplied from the selected cell 10 but also by the current I_Leak supplied from the N-1 unselected cells 10. In data "1" read operation in the NOSRAM 100R, when the total amount of the current I_Leak is increased, the potential VRBL at the time ta sometimes exceeds the potential VREF (see FIG. 5B).

Figure 5B:
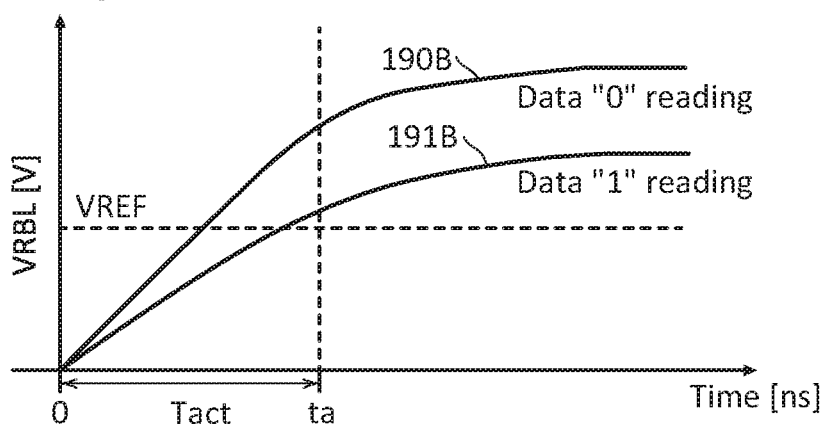

FIG. 5B schematically shows a change in the potential VRBL while the word line RWL is selected in the NOSRAM 100R. Curves 190B and 191B show changes in the potential VRBL when data "0" and data "1" are read.

Even when data "1" is read from the selected cell 10, the read circuit 20 judges that data read by the bit line RBL is data "0." This is incorrect data reading.

In view of the above, in the NOSRAM 100, the cancel circuit 30 is provided in the column circuit 113 to eliminate a data reading error due to the current I_Leak (see FIG. 4B).

The cancel circuit 30 generates current Ican for canceling the current I_Leak supplied from the unselected cell 10 to the bit line RBL. When the current Ican is supplied to the bit line RBL, a potential change of the bit line RBL due to the current I_Leak can be compensated for. In addition, cancel of the current I_Leak by the current Ican results in an improvement in a noise margin for the bit line RBL.

Here, a data reading method of the NOSRAM 100 is to change the potential of the bit line RBL to a potential higher than the precharge potential by current flowing to the selected cell 10. Thus, the cancel circuit 30 functions as a sink-type current source circuit, and the current Ican is sink current.

The NOSRAM 100 can cancel the increase in the potential VRBL due to the current I_Leak by using the current Ican because the NOSRAM 100 includes the cancel circuit 30. Thus, in data "1" read operation, the potential VRBL at the time to can be prevented from exceeding the potential VREF (see FIG. 5C). In other words, in the NOSRAM 100, a data reading error due to leakage current from the unselected cell 10 is reduced.

Figure 5C:
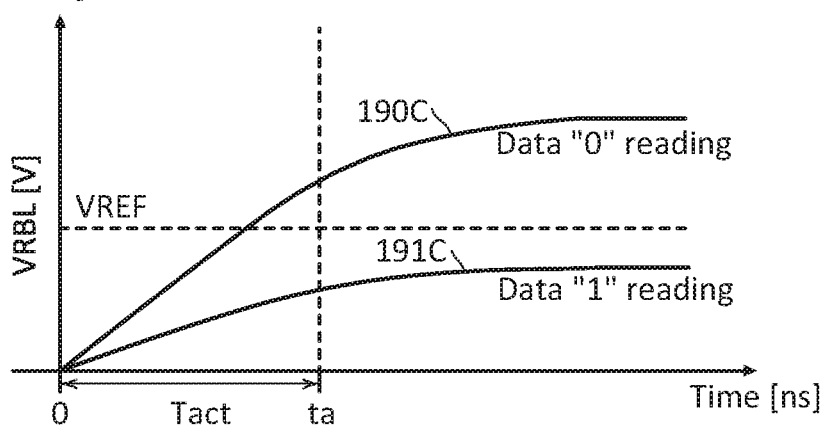

FIG. 5C schematically shows a change in the potential VRBL while the word line RWL is selected in the NOSRAM 100. Curves 190C and 191C show changes in the potential VRBL when data "0" and data "1" are read.

<Cancel Circuit>
(Cancel Circuit 30)

The current Ican can be adjusted in accordance with the value of the potential VCAN supplied to the gate of the transistor MN10. For example, the potential VCAN is set to the potential VDDD, so that the number of external input potentials of the NOSRAM 100 is not increased.

The transistor MN10 has current drive capability high enough to cancel the current I_Leak of the N-1 unselected cells 10. The cancel circuit 30 inhibits charging of the bit line RBL during reading of data "0" from the selected cell 10; thus, the transistor MN10 has lower current drive capability than the transistor MP2 (the read transistor of the cell 10).

The current drive capability of the transistor MN10 can be set by channel width W and channel length L. Specifically, the specification value of the channel width W of the transistor MN10 is the minimum value. In contrast, the specification value of the channel length L of the transistor MN10 is higher than the minimum value. In addition, the channel width W, the channel length L, and the potential VCAN of the transistor MN10 are set in consideration of PVT (process/voltage/temperature) variations and the like of the transistors in the NOSRAM 100.

Other structure examples of cancel circuits are described with reference to FIGS. 6A to 6F.

(Cancel Circuit 31)

Figure 6A:
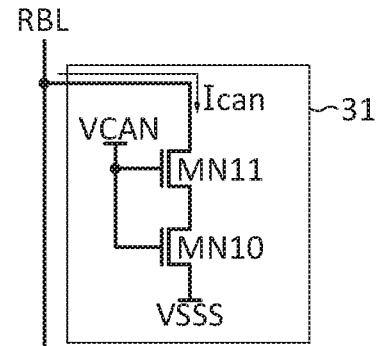
FIGS. 6A to 6G are circuit diagrams each illustrating a structure example of a cancel circuit.

A cancel circuit 31 in FIG. 6A is obtained by addition of a transistor MN11 to the cancel circuit 30. The transistors MN10 and MN11 are electrically connected to each other in series. The specification value of the channel width W of the transistor MN11 is the minimum value. Preferably, the specification value of the channel length L of the transistor MN11 is lower than the channel length L of the transistor MN10 and is the minimum value.

In the case of the cancel circuit 30, when the channel length L of the transistor MN10 is increased, the parasitic capacitance of the transistor MN10 is added to the capacitance of the bit line RBL. The increase in the capacitance of the bit line RBL is a cause of the decrease in read speed of the NOSRAM 100.

Consequently, the transistor MN11 with a short channel length L that is provided between the transistor MN10 and the bit line RBL suppresses the increase in the capacitance of the bit line RBL due to connection of the cancel circuit 31. The size of the transistor MN11 is preferably the minimum size (with the minimum specification values of the channel length L and the channel width W).

(Cancel Circuit 32)

Figure 6B:
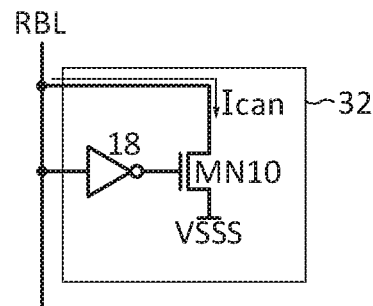

A cancel circuit 32 in FIG. 6B is obtained by addition of an inverter circuit 18 to the cancel circuit 30. In the cancel circuit 32, the potential of the bit line RBL is input to the gate of the transistor MN10 through the inverter circuit 18.

As described above, the cancel circuit 30 inhibits charging of the bit line RBL during the reading of data "0." In addition, the cancel circuit 30 continues consuming static power because the cancel circuit 30 continues supplying the current Ican during the data reading. When the cancel circuit 32 is provided, transition of the potential of the bit line RBL is inhibited at the beginning of the data "0" read operation; however, when the potential of the bit line RBL exceeds the logic threshold value of the inverter circuit 18, data "0" is input to the gate of the transistor MN10. This makes the transistor MN10 off and the cancel circuit 32 stops generation of the current Ican. When the cancel circuit 32 is deactivated, the bit line RBL can be charged promptly, so that the static power consumption of the cancel circuit 32 can be reduced.

(Cancel Circuit 33)

Figure 6C:
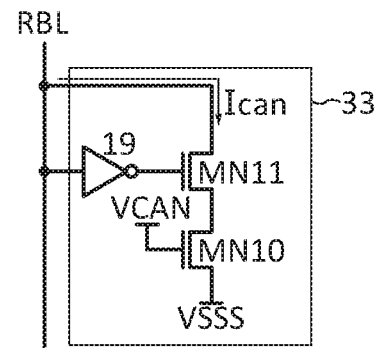
Figure 6D:
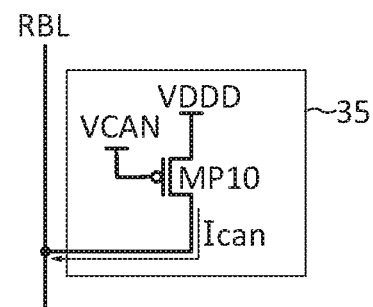
Figure 6E:
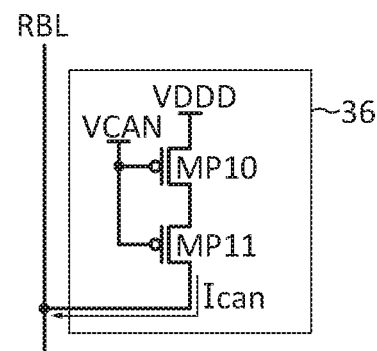
Figure 6F:
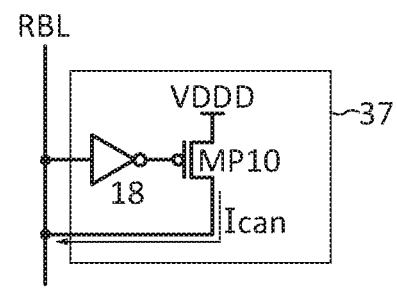
Figure 6G:
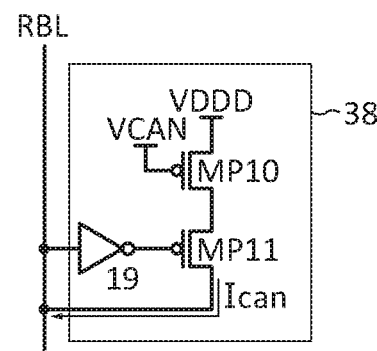

A cancel circuit 33 in FIG. 6C is obtained by addition of an inverter circuit 19 to the cancel circuit 31. In the cancel circuit 33, the potential of the bit line RBL is input to a gate of the transistor MN11 through the inverter circuit 19. Thus, the cancel circuit 33 operates in a manner similar to that of the cancel circuit 32 and has an effect similar to that of the cancel circuit 32.

Transition of the potential of the bit line RBL is inhibited by the current Ican of the cancel circuit 33 at the beginning of data "0" read operation. When the potential of the bit line RBL exceeds the logic threshold value of the inverter circuit 19, data "0" is input to the gate of the transistor MN11. Thus, the cancel circuit 33 is turned off and supply of the current Ican is stopped. When the cancel circuit 33 is turned off, the bit line RBL can be charged promptly, so that the static power consumption of the cancel circuit 33 can be reduced.

Each of the cancel circuits 31 to 33 functions as a sink-type current source circuit in a manner similar to that of the cancel circuit 30. In the case where a data reading method is a method in which the potential of the bit line RBL is changed to a potential higher than the precharge potential by current flowing through a selected cell, any of the cancel circuits 30 to 33 is used as a leakage current cancel circuit.

In contrast, in the case where the data reading method is a method in which the potential of the bit line RBL is changed to a potential lower than the precharge potential by current flowing through a selected cell, a source-type current source circuit is used as the leakage current cancel circuit so that the current Ican can be source current. FIGS. 6D to 6G illustrate structure examples of the leakage current cancel circuit with such a function.

(Cancel Circuits 35 to 39)

Cancel circuits 35 and 37 (FIGS. 6D and 6F) are circuits obtained by changing the n-channel the transistor MN10 included in each of the cancel circuits 30 and 32 into a p-channel transistor MP10. Cancel circuits 36 and 38 (FIGS. 6E and 6G) are circuits obtained by changing the n-channel the transistors MN10 and MN11 included in each of the cancel circuits 33 and 34 into the p-channel transistor MP10 and a p-channel transistor MP11.

The potential VDDD is input to the cancel circuits 35 to 39 as power supply potential. The channel width W and the channel length L of the transistors MP10 and MP11 can be set as in the case of the transistors MN10 and MN11.

<Cell and Memory Cell Array>

Other structure examples of the cell and the memory cell array are described with reference to FIGS. 7A to 7D.

Figure 7A:
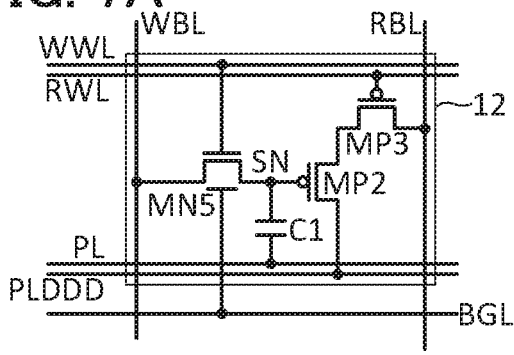
FIGS. 7A to 7D are circuit diagrams illustrating structure examples of memory cells and a memory cell array.

A cell 12 in FIG. 7A is a 3T gain cell and corresponds to the cell 11 to which a transistor MP3 is added. The transistor MP3 is a selection transistor. The cell 12 is electrically connected to the word lines WWL and RWL, the bit lines WBL and RBL, and wirings PL and PLDDD. A gate of the transistor MP3 and the capacitor C1 are electrically connected to the word line RWL and the wiring PL, respectively. Fixed potential (e.g., VDDD) is input to the wiring PL. The wiring PLDDD is an alternative to the source line SL and functions as a power supply line for the potential VDDD. The transistors MP2 and MP3 are electrically connected to each other in series between the bit line RBL and the wiring PLDDD.

When the memory cell array includes the cell 12, a column circuit may include any of the cancel circuits 30 to 33 as a cancel circuit for the potential of the bit line RBL. In that case, the column circuit cannot include a source line driver circuit.

Figure 7B:
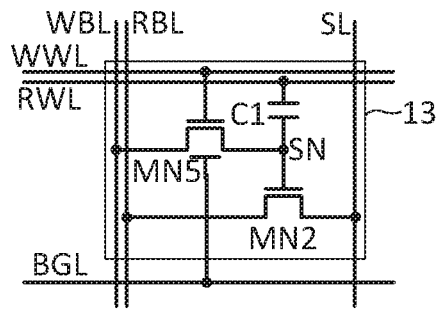

A cell 13 in FIG. 7B is a modification example of the cell 11. The read transistor MP2 included in the cell 11 is a p-channel transistor, and a read transistor MN2 included in the cell 13 is an n-channel transistor.

Figure 7C:
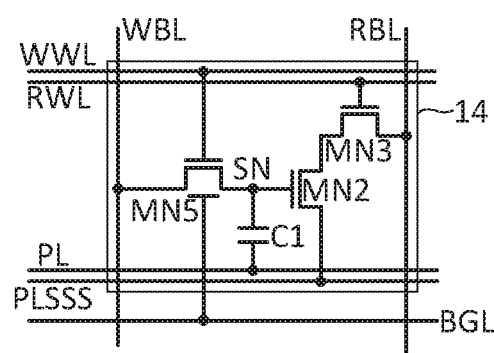

A cell 14 in FIG. 7C is a modification example of the cell 12. The read transistor MP2 and the selection transistor MP3 included in the cell 12 are p-channel transistors, and the read transistor MN2 and a selection transistor MN3 included in the cell 13 are n-channel transistors. Instead of the wiring PLDDD, a wiring PLSSS is electrically connected to the cell 14. For example, the potential VSSS is input to the wirings PL and PLSSS from the outside.

When the memory cell array includes the cell 14, a column circuit may include any of the cancel circuits 35 to 38 as a cancel circuit for the potential of the bit line RBL. The same applies to the case where the memory cell array includes the cell 13.

The cell 14 may include the transistor MN1 that does not include a back gate instead of the transistor MN5. The same applies to the cells 12 and 13.

Figure 7D:
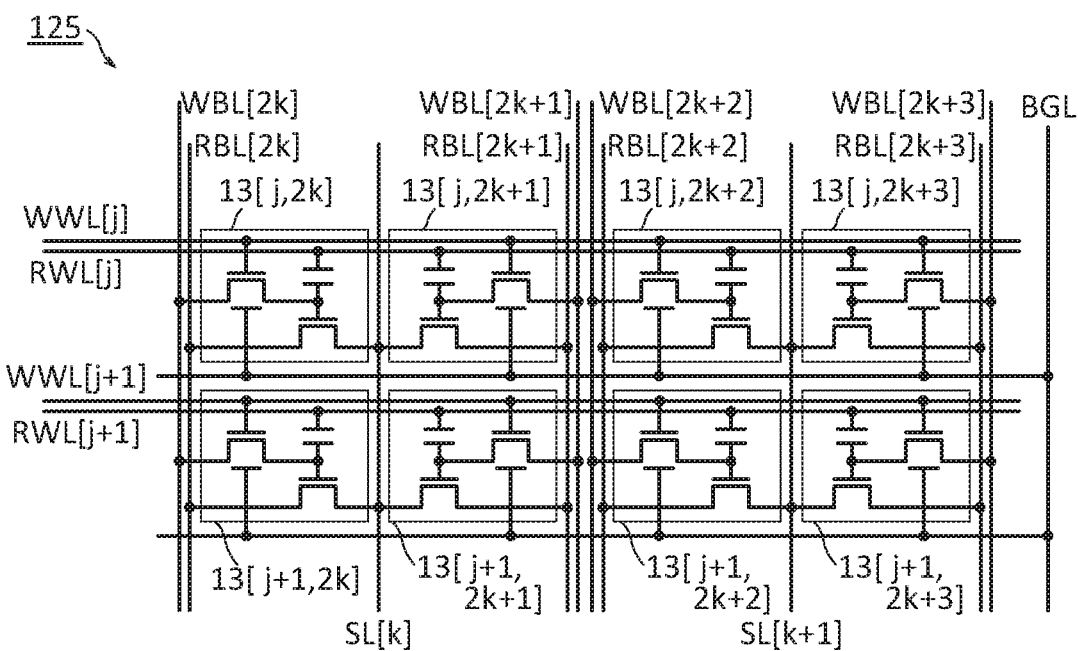

In the memory cell array, a wiring can be used in common between adjacent two columns or adjacent two rows in some cases. FIG. 7D illustrates such a structure example. A memory cell array 125 in FIG. 7D includes the cells 13, and the source line SL is used in common between adjacent two columns. In FIG. 7D, j and k are each an integer greater than or equal to 0.

In the NOSRAM in this embodiment, leakage current that leaks from an unselected cell to a bit line can be canceled. Thus, a noise margin for the bit line can be improved. Cancel of the leakage current and the improvement in the noise margin for the bit line are highly effective in preventing incorrect data reading.

Needless to say, application of this embodiment is not limited to a NOSRAM. This embodiment can be applied to a gain-cell DRAM in which a write transistor of a memory cell is a Si transistor. In the gain-cell DRAM, the write transistor of the memory cell may be either an n-channel transistor or a p-channel transistor.

More specific structure examples of the NOSRAM will be described below in Embodiments 2 and 3. Needless to say, application of Embodiments 2 and 3 is not limited to a NOSRAM. Embodiments 2 and 3 can be applied to a gain-cell DRAM in which a write transistor of a memory cell is a Si transistor.

Embodiment 2

<Structure Example of NOSRAM>

Figure 8:
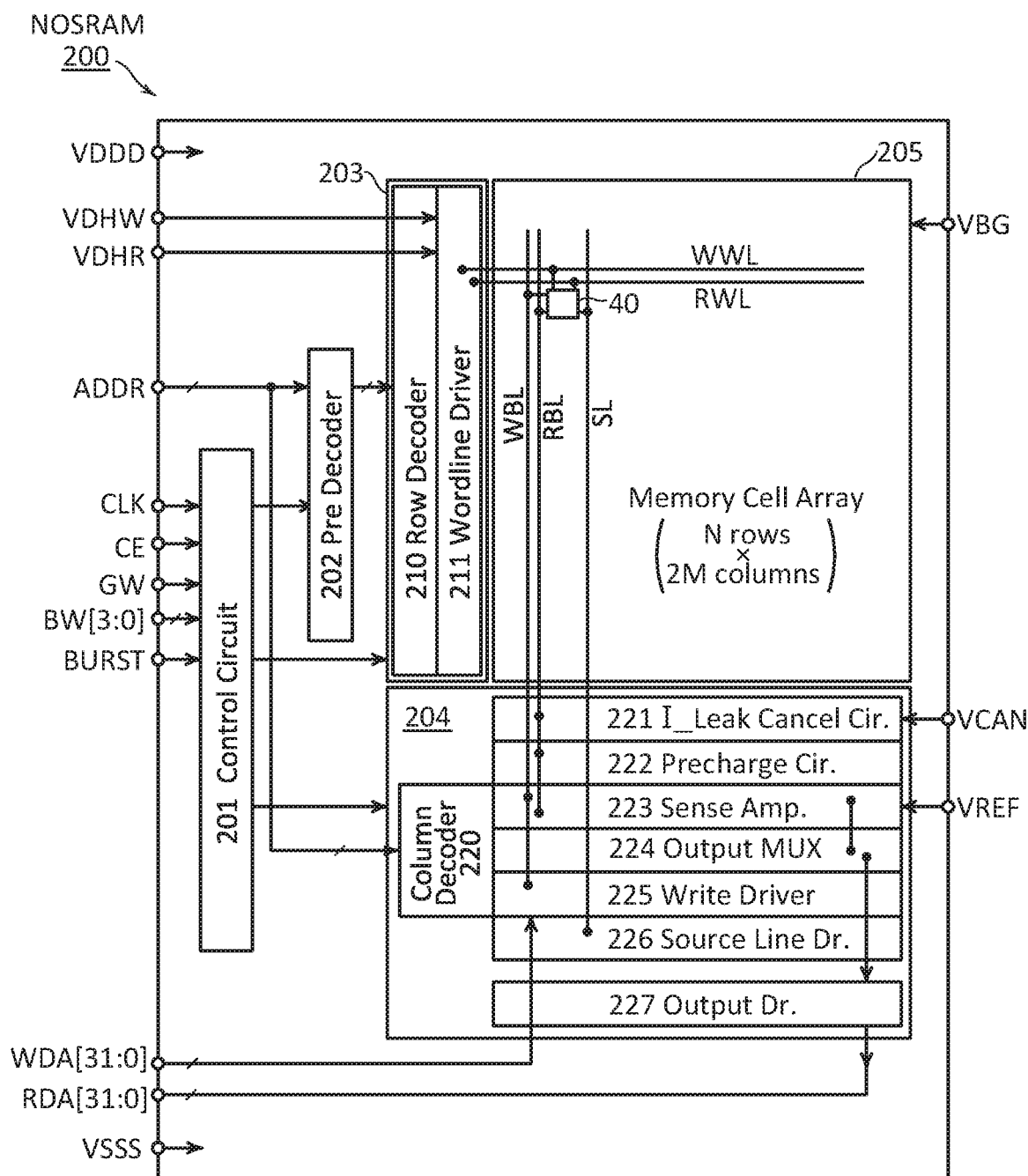
FIG. 8 is a block diagram illustrating a structure example of a NOSRAM.

FIG. 8 is a block diagram illustrating a structure example of a NOSRAM. A NOSRAM 200 includes a control circuit 201, a predecoder 202, a row circuit 203, a column circuit 204, and a memory cell array 205. The memory cell array 205 includes cells 40, the word lines WWL and RWL, the bit lines WBL and RBL, and the source line SL.

The potentials VDDD, VSSS, VDHW, VDHR, VCAN, VREF, and VBG are input to the NOSRAM 200.

The signals CLK, CE, GW, and BW, and signals BURST and ADDR are input to the NOSRAM 200. The signal CLK is a clock signal. The signal CE is a chip enable signal. The signal GW is a global write enable signal. The signal BW is a byte write enable signal. The signal BURST is a burst signal controlling burst operation. The signal ADDR is an address signal. Data WDA is write data input from the outside. Data RDA is read data output from the NOSRAM 200.

The circuits, signals, and potentials in the NOSRAM 200 can be selected as appropriate. Another circuit or signal may be added. Structures (e.g., bit lengths) of input and output signals to and from the NOSRAM 200 are determined based on the operation mode of the NOSRAM 200, the structure of the memory cell array, and the like. Here, the bit length of the signal BW is 4 bits, and the bit length of each of the data WDA and the data RDA is 32 bits.

(Control Circuit 201)

The control circuit 201 has a function of controlling the entire operation of the NOSRAM 200. The control circuit 201 has a function of performing logical operation of the signals CE, GW, BW[3:0], and BURST to determine an operation mode, and a function of generating control signals for the row circuit 203 and the column circuit 204 so that the determined operation mode is executed. Table 1 is a truth table of the control circuit 201.

TABLE 1

| Operation | CE | GW | BW[0] | BW[1] | BW[2] | BW[3] | BURST |
|---|---|---|---|---|---|---|---|
| Standby | L | X | X | X | X | X | X |
| Read | H | L | L | L | L | L | L |
| Byte 0 write | H | H | H | L | L | L | L |
| Half-word write | H | H | H | H | L | L | L |
| Word write | H | H | H | H | H | H | L |
| Burst read | H | L | L | L | L | L | H |
| Burst write | H | H | H | H | H | H | H |
| Refresh | H | H | L | L | L | L | L |

Note that the byte 0 write operation means operation for writing data of 1 byte (8 bits) assigned to a signal BW[0]. For example, in the byte 0 write operation, data WDA[7:0] is written. In byte write operation, when signals BW[1], BW[2], and BW[3] are "H," data WDA[15:8], WDA[23:16], and WDA[31:24] are written.

<Predecoder 202>

The predecoder 202 is provided when the memory cell array 205 is divided into a plurality of blocks, for example. The predecoder 202 has a function of decoding the signal ADDR and determining a block to be accessed.

<Row Circuit 203>

The row circuit 203 includes a row decoder 210 and a word line driver 211. The row decoder 210 decodes the signal ADDR and generates control signals for the word line driver 211. The word line driver 211 has a function of driving the word lines WWL and RWL. The word line driver 211 selects the word line WWL or RWL in a row to be accessed in response to the control signal for the row decoder 210. The potentials VDHW and VDHR are input to the word line driver 211. The potential VDHW is high-level potential of the word line WWL. The potential VDHR is high-level potential of the word line RWL.

<Column Circuit 204>

The column circuit 204 has a function of writing data to the memory cell array 205, a function of reading data from the memory cell array 205, a function of amplifying data, a function of storing data temporarily, and the like. The column circuit 204 in the example in FIG. 8 includes a column decoder 220, a leakage current (I_Leak) cancel circuit 221, a precharge circuit 222, a sense amplifier 223, an output MUX (multiplexer) 224, a write driver 225, a source line driver 226, and an output driver 227. A circuit structure example of the column circuit 204 will be described below.

<Memory Cell Array 205>

Figure 9:
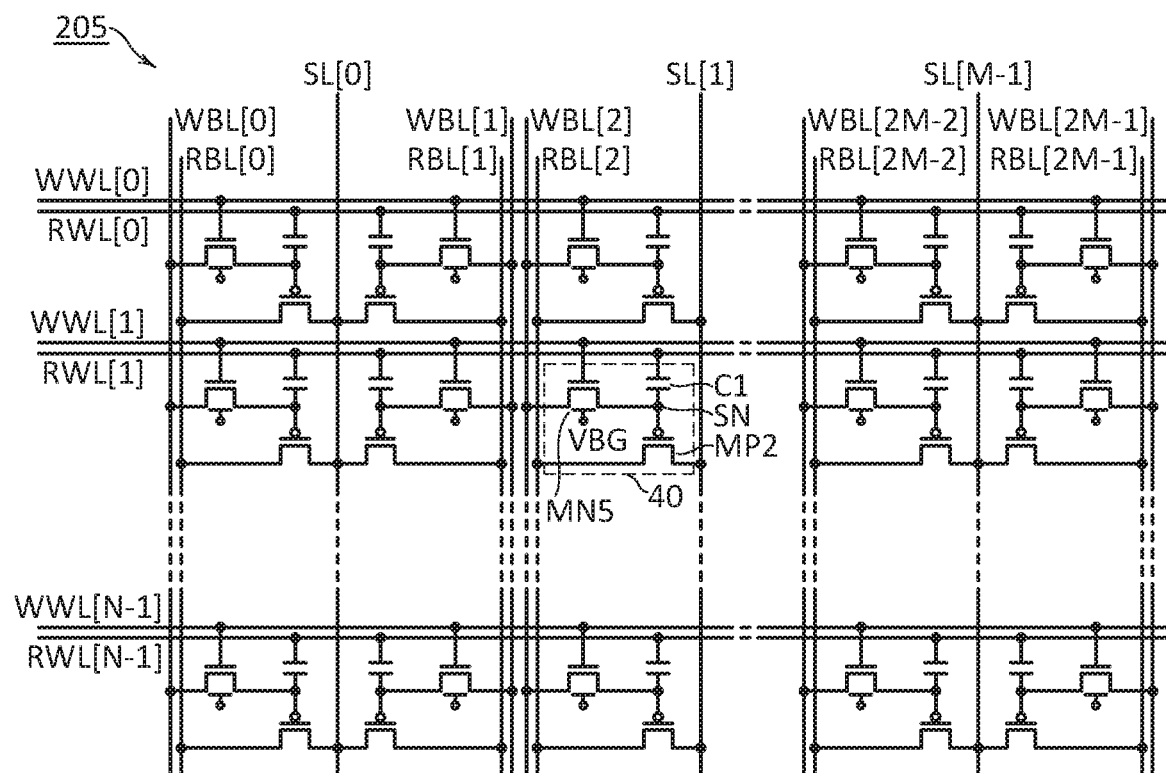
FIG. 9 is a circuit diagram illustrating a structure example of a memory cell array.

FIG. 9 illustrates a structure example of the memory cell array 205. The number of rows in the memory cell array 205 is N, and the number of columns in the memory cell array 205 is 2M. The circuit structure of the cell 40 is similar to that of the cell 11 (see FIG. 1C). The cell 40 includes the node SN, the transistors MN5 and MP2, and the capacitor C1. Each transistor MN5 included in the memory cell array 205 is electrically connected to the wiring BGL (not illustrated). The potential VBG is input to the wiring BGL.

The structure of the memory cell array 205 is similar to that of the memory cell array 125 (see FIG. 7D). The source wiring SL is used in common between two adjacent columns (an even-numbered column and an odd-numbered column).

<Column Circuit 204>

Figure 10:
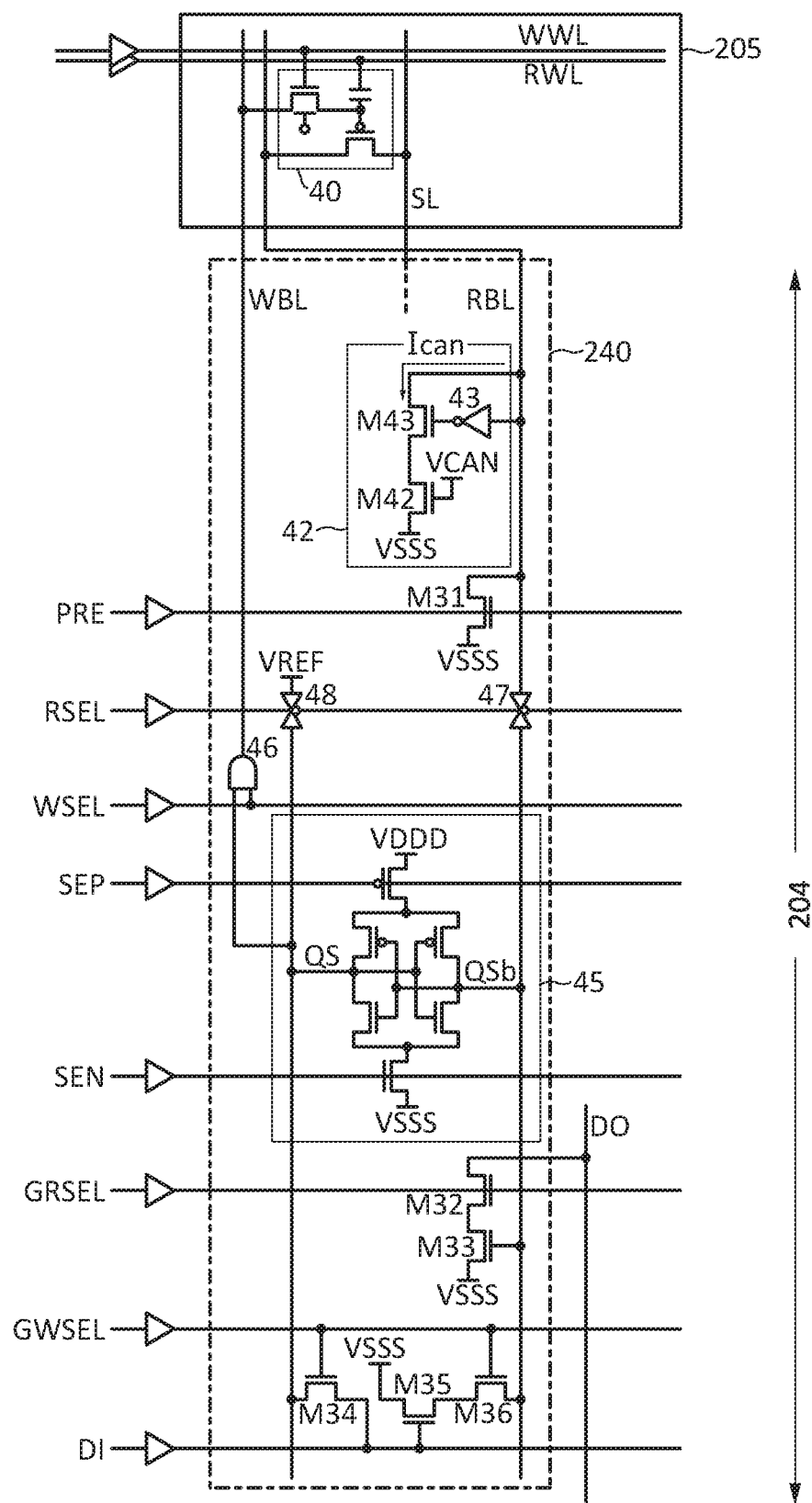
FIG. 10 is a circuit diagram illustrating a structure example of a column circuit.

FIG. 10 is a circuit diagram illustrating a structure example of the column circuit 204. In the column circuit 204, a circuit 240 is provided for each column. The circuit 240 includes transistors M31 to M36, a cancel circuit 42, a sense amplifier 45, an AND circuit 46, and analog switches 47 and 48.

The column circuit 204 operates in response to signals SEN[3:0], SEP[3:0], PRE, RSEL[3:0], WSEL, GRSEL[3:0], and GWSEL[15:0]. Note that a 1-bit signal of any of the 4-bit signal SEN[3:0] is input to each circuit 240. The same applies to other signals such as the signal SEP[3:0].

The column circuit 204 writes data DI[31:0] to the memory cell array 205 and reads data DO[31:0] from the memory cell array 205. The data DI[31:0] and the data DO[31:0] are internal signals, which correspond to data WDA[31:0] and data RDA[31:0], respectively.

(Leakage Current Cancel Circuit 221)

The cancel circuit 42 is included in the leakage current cancel circuit 221. The cancel circuit 42 is electrically connected to the bit line RBL. The cancel circuit 42 has a circuit structure similar to that of the cancel circuit 33 (FIG. 6C), and includes transistors M42 and M43 and an inverter circuit 43. Any of the cancel circuits 30 to 32 can be used as the cancel circuit 42.

(Precharge Circuit 222)

The transistor M31 is included in the precharge circuit 222. The bit line RBL is precharged to the potential VSSS by the transistor M31. The signal PRE is a precharge signal, which controls the on/off state of the transistor M31.

(Sense Amplifier 223)

The sense amplifier 223 has a function of judging whether data input to the bit line RBL is "0" or "1" and a function of temporarily retaining data DI input from the write driver 225.

The sense amplifier 45 is included in the sense amplifier 223. The sense amplifier 45 here is a latch sense amplifier. Two connection portions, an input node and an output node for two inverter circuits in the sense amplifier 45, are nodes QS and QSb. Complementary data is retained in the nodes QS and QSb. Signals SEN and SEP are sense amplifier enable signals for activating the sense amplifier 45.

The circuit 240 includes a circuit that controls electrical continuity between the sense amplifier 45, the bit lines WBL and RBL, and a wiring for supplying the potential VREF (hereinafter such a wiring is referred to as a VREF line). The AND circuit 46 controls electrical continuity between the node QS and the bit line WBL. The analog switch 47 controls electrical continuity between the node QSb and the bit line RBL. The analog switch 48 controls electrical continuity between the node QS and the VREF line. The signal WSEL is a write selection signal, which controls the AND circuit 46. The signal RSEL[3:0] is a read selection signal, which controls the analog switches 47 and 48.

The sense amplifier 45 functions as a latch circuit that stores data temporarily in write operation, and functions as a read circuit in read operation. The potential VREF is read judge potential. The sense amplifier 45 determines whether the potential of the node QSb at the time of activation is data "0" or "1" with reference to the potential VREF.

<Output MUX 224 and Output Driver 227>

The output MUX 224 reads the data DO[31:0] from the sense amplifier 223 and outputs the data DO[31:0] to the output driver 227.

Transistors M32 and M33 are included in the output MUX 224. The signal GRSEL[3:0] is a global read selection signal and controls the output MUX 224. The output MUX 224 is a multiplexer of 2M inputs and 32 outputs and has a function of selecting 32 bit lines RBL from the 2M bit lines RBL. Data is read from the 32 bit lines RBL.

The circuits 240 in every four columns are electrically connected to a wiring for outputting data DO[j] (j is an integer of 0 to 31). For example, circuits 240[0] to 240[3] are electrically connected to a wiring for outputting data D0[0].

<Write Driver 225>

The write driver 225 has a function of writing the data DI[31:0] to the sense amplifier 223.

The signal GWSEL[15:0] is a global write selection signal. The write driver 225 writes data in byte units, half-word units, or word units in response to the signal GWSEL[15:0]. Specific functions of the write driver 225 include a function of selecting a column to which data DI[j] is written and a function of writing the data DI[j] to the sense amplifier 45 in the selected column.

The transistors M34 to M36 are included in the write driver 225. The circuits 240 in every four columns are electrically connected to a common wiring for inputting the data DI[j]. For example, the circuits 240[0] to 240[3] are electrically connected to a wiring for inputting data DI[0].

\<Source Line Driver 226\>

The source line driver 226 drives the source line SL.

\<Operation Example of NOSRAM 200\>

An operation example of the NOSRAM 200 is described with reference to timing charts in FIG. 11 and FIG. 12.

\<Read Operation\>

Figure 11:
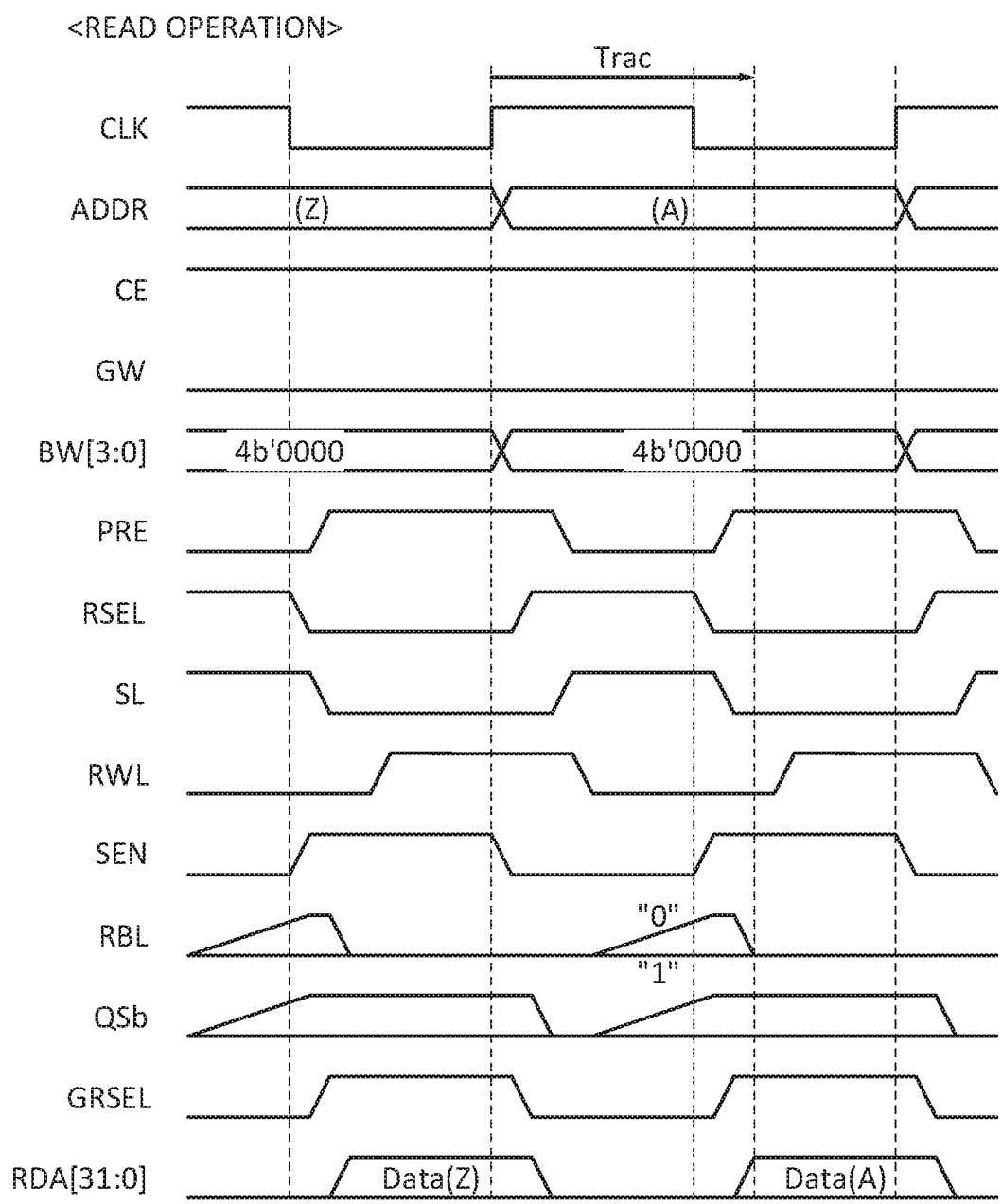
FIG. 11 is a timing chart illustrating an example of read operation of a NOSRAM.

FIG. 11 is a timing chart of read operation. Addresses (Z) and (A) are input for different clock cycles, and data (Z) and (A) are read from the cells 40 specified by the addresses (Z) and (A), respectively. Trac represents read access time.

The read operation in the NOSRAM 200 is similar to the read operation in the NOSRAM 100 in FIG. 3. The read operation is described focusing on the address (A).

The NOSRAM 200 performs the read operation while the signals CE, GW, and BW[3:0] are "1," "0," and "0000," respectively (Table 1).

First, the bit line RBL is precharged. While the signal RPE is "H," the bit line RBL is precharged to the potential VSSS. An "H" signal is input to the transistor M43; thus, the cancel circuit 42 is on and generates the current Ican.

Then, the signal RSEL is set to "H" to establish electrical continuity between the bit line RBL and the node QSb and between the VREF line and the node QS. As a result, the potentials of the nodes QSb and QS become VSSS and VREF, respectively. The signal PRE is set to "L" to stop the precharge of the bit line RBL. At the same time as the precharge stop, charge of the source line SL with the potential VDDD is started.

Next, the word line RWL in a row to be read is set to "L." In the case where the selected cell 40 retains data "0," the bit line RBL is charged by current of the selected cell 40. The increase in the potential of the bit line RBL is inhibited by the current Ican at the beginning of the period during which the word line RWL is "L." When the potential of the bit line RBL exceeds the logic threshold value of the inverter circuit 43, the transistor M43 is turned off and the cancel circuit 42 stops supply of the current Ican. When the cancel circuit 42 is turned off, the potential of the bit line RBL is increased promptly.

In the case where the selected cell 40 retains data "1," current hardly flows between the selected cell 40 and the bit line RBL. The cancel circuit 42 is on and continues inputting the current Ican to the bit line RBL. Thus, leakage current that leaks from the unselected cell 40 to the bit line RBL is canceled by the current Ican. Consequently, the potential of the bit line RBL is hardly increased from the precharge potential (VSSS).

The signal RSEL is set to "L" to break electrical continuity between the bit line RBL and the node QSb and between the VREF line and the node QS. At the same time as the signal RSEL is set to "L," the signals SEN and SEP are set to "H" and "L," respectively, and the sense amplifier 45 is activated to reach the nodes QS and QSb full swing. At activation of the sense amplifier 45, if the potential VREF is higher than the potential of the node QSb, the potential of the node QSb/QS is VSSS/VDDD. If the potential VREF is lower than the potential of the node QSb, the potential of the node QSb/QS is VDDD/VSSS.

In the case where data "1" is read from the selected cell 40, a potential change in the bit line RBL is compensated for by the current Ican of the cancel circuit 42; thus, the potential of the node QSb at the time of activation of the sense amplifier 45 can be inhibited from exceeding the potential VREF. As a result, the sense amplifier 45 can be prevented from making an error on a decision whether the data is "0" or "1."

When the signal GRSEL is set to "H," the data (A) is output from the column circuit 204. The signal PRE is also set to "H" along with setting the signal GRSEL to "H," so that precharge of the bit line RBL is started and input of the potential VSSS to the source line SL is started.

The word line RWL is set to "H" to set the cell 40 in a non-selected state. Then, the signals SEN and SEP are set to "L" and "H," respectively, to deactivate the sense amplifier 45. Next, the signal GRSEL is set to "L" to finish the read operation.

\<Write Operation\>

Figure 12:
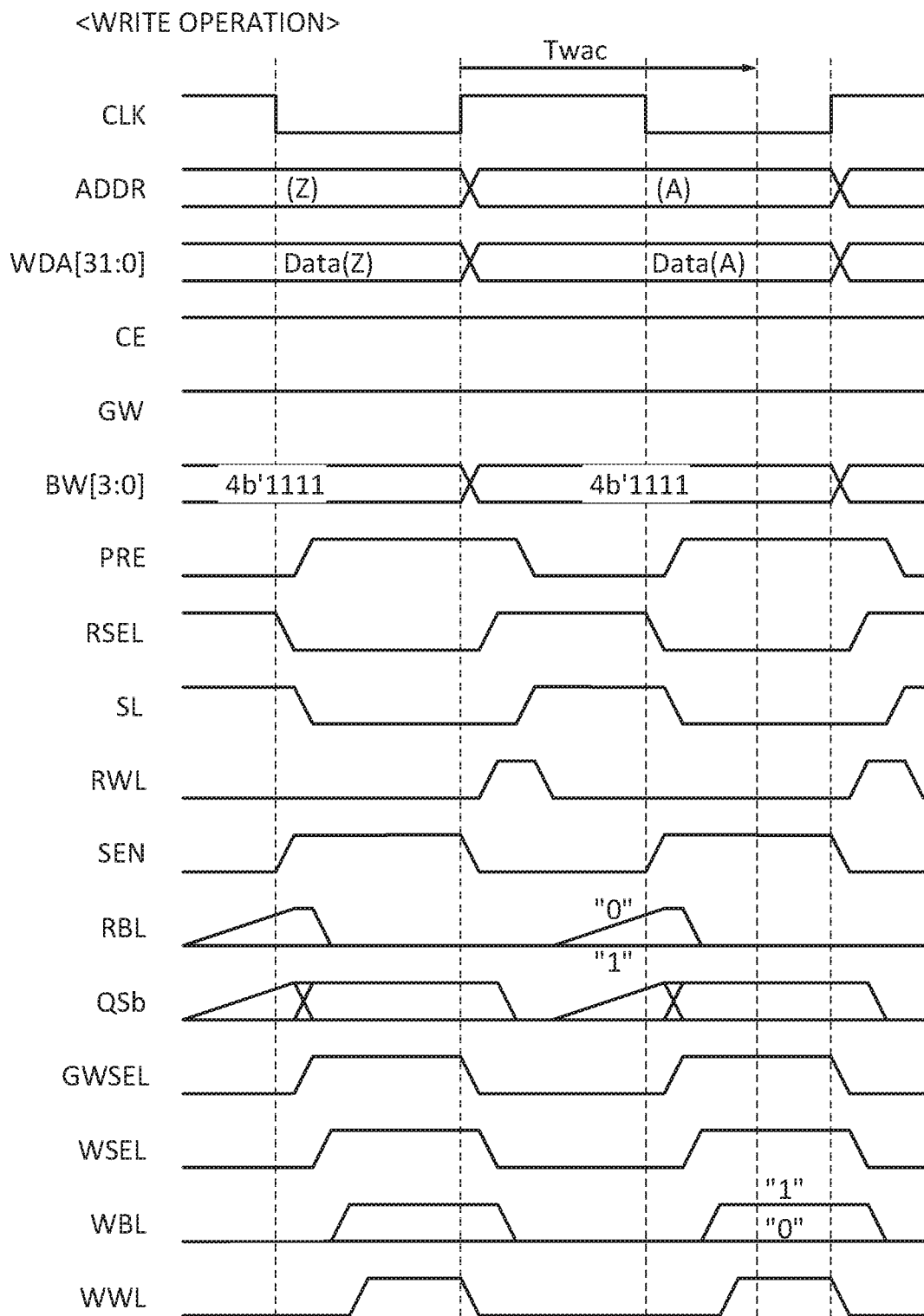
FIG. 12 is a timing chart illustrating an example of write operation of a NOSRAM.

FIG. 12 is a timing chart of write operation. The different addresses (Z) and (A) and the data (Z) and (A) are input for clock cycles, and the data (Z) and (A) are written to the cells 40 specified by the addresses (Z) and (A), respectively. Twac represents write access time. Here, the write operation is described focusing on the address (A).

Since the signals CE, GW, and BW[3:0] are "1," "1," and "1111," respectively, the NOSRAM 200 performs the write operation.

The NOSRAM 200 supports partial write operation. While the signal WSEL is "L," first, data is read from the cell 40 in a write-target row to the bit line RBL. The read operation is similar to the read operation in FIG. 11.

Next, the signals SEN and SEP are set to "H" and "L," respectively, along with setting the signal RSEL to "L," so that the sense amplifier 45 is activated. When the data of the cell 40 in the write-target row is "0"/"1," the potential of the node QSb is VDDD/VSSS.

Then, the signal GWSEL is set to "H" to write the data DI to the node QS. Data of the sense amplifier 45 in a column selected by the signal GWSEL is updated by the data DI. Data of the sense amplifier 45 in an unselected column is not updated.

The signal PRE is also set to "H" along with setting the signal GRSEL to "H," so that precharge of the bit line RBL is started and the potential of the source line SL is changed into the potential VSSS.

Next, the signal WSEL is set to "H" to write data based on the potential of the node QS to the bit line WBL. Then, the word line WWL is set to "H" to write data of the bit line WBL to the cell 40. The data DI is written to the cell 40 in a selected column. Retained data is written back to the cell 40 in the unselected column.

The signal GWSEL, the word line WWL, and the signal SEN are set to "L," and the signal SEP is set to "H." Then, the signal WSEL is set to "L" to finish the write operation.

Embodiment 3

\<Structure Example of NOSRAM\>

Figure 13A:
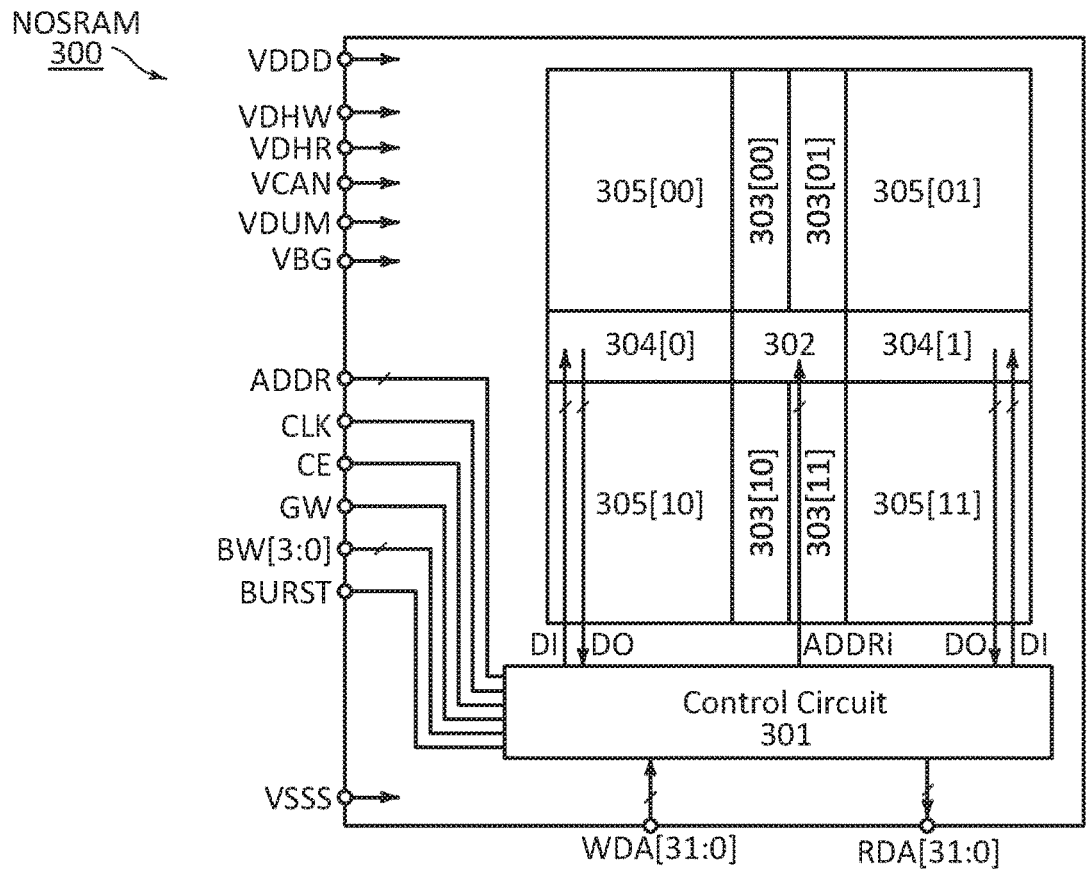
FIGS. 13A and 13B are block diagrams illustrating a structure example of a NOSRAM.

FIG. 13A a is a block diagram illustrating a structure example of a NOSRAM. A NOSRAM 300 includes a memory cell array, a control circuit 301, a predecoder 302, four row circuits 303[00] to 303[11], and two column circuits 304[0] and 304[1]. The memory cell array in the example of FIG. 13A is divided into four. Here, the four memory cell arrays are referred to as blocks 305[00] to 305[11].

A row circuit 303M is a row circuit of a block 305[XX] (X is 0 or 1). One column circuit 304 is used in common between two blocks 305. The column circuit 304[0] is used in common between the blocks 305[00] and 305[10]. The column circuit 304[1] is used in common between the blocks 305[01] and 305[11].

The NOSRAM 300 is supplied with the signals CLK, CE, GW, BW[3:0], BURST, and ADDR, and the data WDA[31:

0] and outputs the data RDA[31:0]. The potentials VDDD, VSSS, VDHW, VDHR, VCAN, and VBG and potential VDUM are input to the NOSRAM 300.

The circuits, signals, and potentials in the NOSRAM 300 can be selected as appropriate as in the case of the NOSRAM 200. Another circuit or signal may be added. Structures (e.g., bit lengths) of input and output signals to and from the NOSRAM 300 are determined based on the operation mode of the NOSRAM 300, the structure of the memory cell array, and the like.

<Control Circuit 301>

The control circuit 301 has a function of controlling the entire operation of the NOSRAM 300. The control circuit 301 has a function of performing logical operation of the signals CE, GW, BW[3:0], and BURST to determine an operation mode, and a function of generating control signals for the row circuits 303[00] to 303[11] and the column circuit 304 so that the determined operation mode is executed. Table 2 is a truth table of the control circuit 301. The truth table of the control circuit 301 is the same as the truth table of the control circuit 201 in the NOSRAM 200 (Table 1 in Embodiment 2).

TABLE 2

| Operation | CE | GW | BW[0] | BW[1] | BW[2] | BW[3] | BURST |
|---|---|---|---|---|---|---|---|
| Standby | L | X | X | X | X | X | X |
| Read | H | L | L | L | L | L | L |
| Byte 0 write | H | H | H | L | L | L | L |
| Half-word write | H | H | H | H | L | L | L |
| Word write | H | H | H | H | H | H | L |
| Burst read | H | L | L | L | L | L | H |
| Burst write | H | H | H | H | H | H | H |
| Refresh | H | H | L | L | L | L | L |

<Predecoder 302>

The predecoder 302 has a function of decoding a signal ADDRi and determining a block 305 to be accessed. The signal ADDRi is an internal address signal generated by the control circuit 301 from the signal ADDR. Note that the signal ADDR can be input to the predecoder 302.

A more specific structure example of the row circuit 303, the column circuit 304, and the block 305 is described with reference to FIG. 13B. The row circuit 303 includes a row decoder 310 and a word line driver 311. The column circuit 304 includes a column decoder 320, a leakage current (I_Leak) cancel circuit 321, a precharge circuit 322, a sense amplifier 323, an output MUX 324, a write driver 325, and a source line driver 326.

Figure 13B:
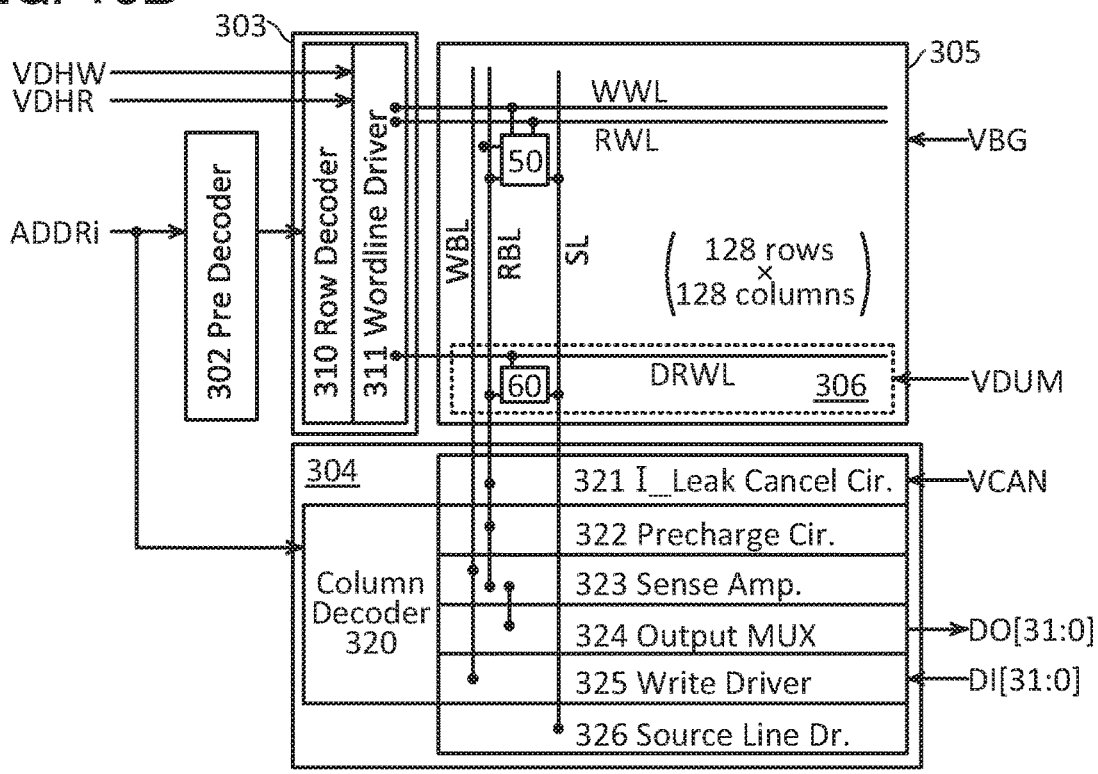

In the example of FIG. 13B, the block 305 is a memory cell array in 128 rows and 128 columns. The block 305 includes a cell 50, the word lines WWL and RWL, the bit lines WBL and RBL, the source line SL, and a replica cell array 306.

<Row Circuit 303>

The row decoder 310 has a function of decoding a row address. The word line driver 311 drives the word lines WWL and RWL and a word line DRWL in response to signals transmitted from the row decoder 310 and the control circuit 301. The potentials VDHW and VDHR are input to the word line driver 311. The potential VDHW is high-level potential of the word line WWL. The potential VDHR is high-level potential of the word lines RWL and DRWL.

<Block 305>

Figure 14:
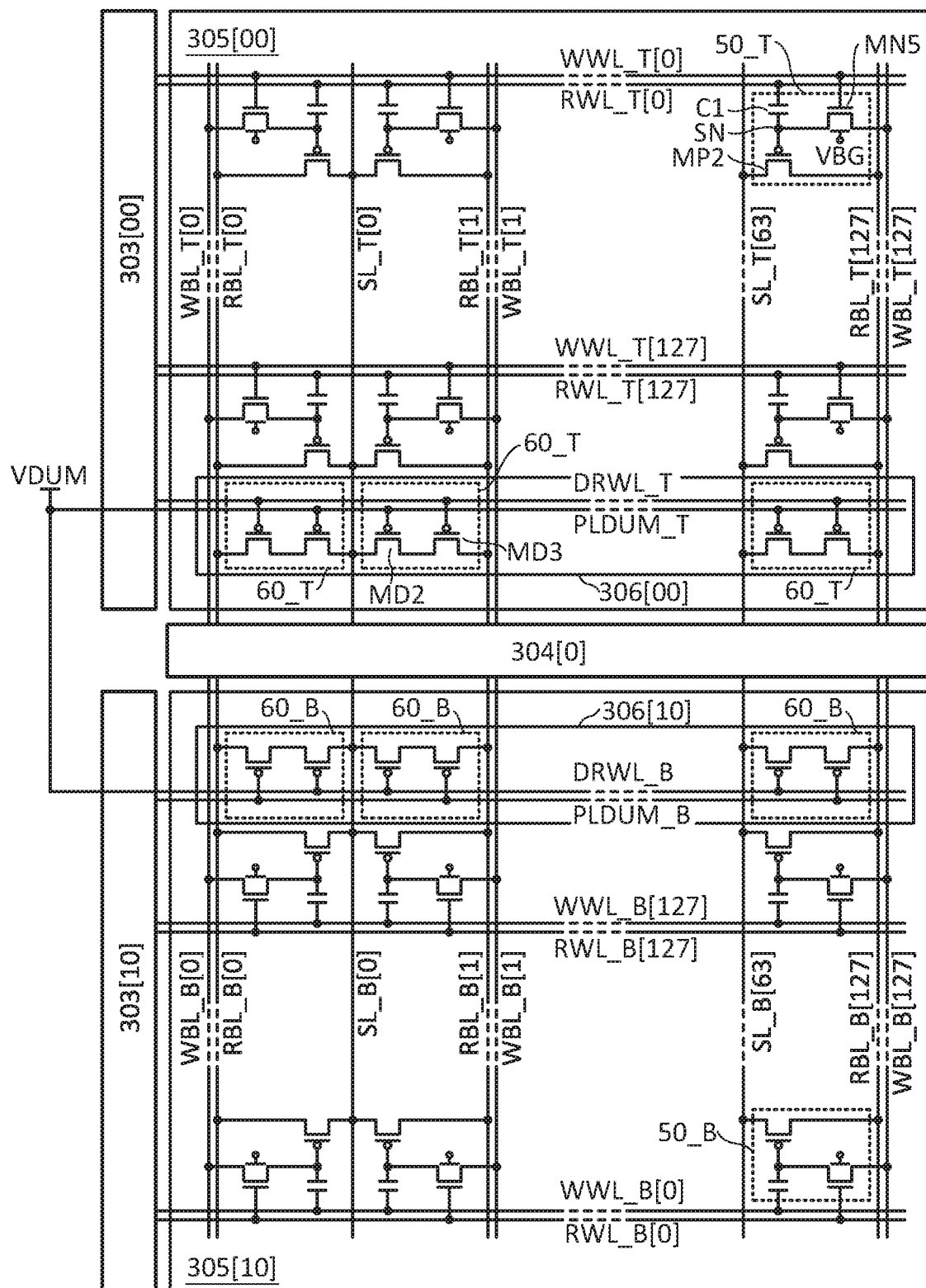
FIG. 14 is a circuit diagram illustrating a structure example of a block.

A structure example of the block 305 is described with reference to FIG. 14. FIG. 14 illustrates a circuit structure example of the blocks 305[00] and 305[10]. Note that when circuit elements, signals, and the like are distinguished between the blocks 305[00] and 305[10], references "_T" and "_B" are used. For example, the bit line RBL_T is the bit line RBL of the block 305[00], and the bit line RBL_B is the bit line RBL of the block 305[10].

The cell 50 has the same circuit structure as the cell 10. The back gate of the transistor MN5 included in the cell 50 is electrically connected to the wiring BGL for supplying the potential VBG.

A replica cell array 306[00] in the block 305[00] is used for a generation circuit of read judge potential for the block 305[10], and a replica cell array 306[10] is used for a generation circuit of read judge potential for the block 305[00].

The replica cell array 306 includes replica cells 60, the word line DRWL, and a wiring PLDUM. The replica cells 60 are arranged in one row and 128 columns and are electrically connected to the word line DRWL, the bit line RBL, and the source line SL. The word line DRWL is a dummy read word line. The wiring PLDUM is a power supply line for inputting the potential VDUM to the replica cells 60.

Each of the replica cells 60 includes transistors MD2 and MD3. The transistors MD2 and MD3 are a read transistor and a selection transistor of a 3T gain cell, respectively. The reason why the transistors MD2 and MD3 are p-channel transistors is that the read transistor of the cell 50 is a p-channel transistor.

The transistors MD2 and MD3 are electrically connected to each other in series between the bit line REFBL and the source line SL. In the replica cell 60, a gate of the transistor MD2 is electrically connected to the wiring PLDUM instead of a retention node, and a gate of the transistor MD3 is electrically connected to the word line DRWL.

<Column Circuit 304>

A circuit structure example of the column circuit 304[0] is described with reference to FIG. 15. The column circuit 304[1] has a similar structure.

In the column circuit 304[0], a circuit 329 is provided for each column. The circuit 329 includes the transistors M1 to M7, cancel circuits 52T and 52B, a sense amplifier 55, analog switches 56 and 57, and OR circuits 58 and 59.

The column circuit 304[0] operates in response to the signals SEN[3:0], SEP[3:0], PRE, RSEL[3:0], GRSEL[3:0], and GWSEL[15:0], and signals WSEL_T and WSEL_B. Note that a 1-bit signal of any of the 4-bit signal SEN[3:0] is input to each circuit 329. The same applies to other signals such as the signal SEP[3:0].

(Leakage Current Cancel Circuit 321)

The cancel circuits 52T and 52B are included in the leakage current cancel circuit 321. The cancel circuit 52T is electrically connected to the bit line RBL_T. The cancel circuit 52B is electrically connected to the bit line RBL_B. The cancel circuit 52T is a circuit for canceling the current I_Leak that leaks from a cell 50_B in the block 305[10]. The cancel circuit 52B is a circuit for canceling the current I_Leak that leaks from a cell 50_T in the block 305[00].

The cancel circuit 52T has a circuit structure similar to that of the cancel circuit 33 (FIG. 6C), and includes transistors M52 and M53 and an inverter circuit 53. The cancel circuit 52B has the same circuit structure as the cancel circuit 52T. Any of the cancel circuits 30 to 32 can be used as the cancel circuits 52T and 52B.

(Precharge Circuit 322)

The transistors M1 and M2 are included in the precharge circuit 322. The bit line RBL_T is precharged to the potential VSSS by the transistor M1. The bit line RBL_B is precharged to the potential VSSS by the transistor M2. The signal PRE is a precharge signal, which controls the on/off states of the transistors M1 and M2.

(Sense Amplifier 323)

The sense amplifier 323 has a function of judging whether data input to the bit line RBL is "0" or "1" and a function of temporarily retaining data DO input from the write driver 325.

The sense amplifier 55 is included in the sense amplifier 323. The sense amplifier 55 is a latch sense amplifier, which includes the nodes QS and QSb. The signals SEN and SEP are sense amplifier enable signals for activating the sense amplifier 55.

The circuit 329 includes a circuit controlling electrical continuity between the sense amplifier 55, and the bit lines RBL_T and RBL_B and bit lines WBL_T and WBL_B.

The analog switch 56 controls electrical continuity between the node QSb and the bit line RBL_T. The analog switch 57 controls electrical continuity between the node QS and the bit line RBL_B. The signal RSEL is a read selection signal, which controls the analog switches 56 and 57.

The OR circuit 58 controls electrical continuity between the node QS and the bit line WBL_T. The OR circuit 59 controls electrical continuity between the node QSb and the bit line WBL_B. The signals WSEL_T and WSEL_B are write selection signals, which control the OR circuits 58 and 59.

Figure 15:
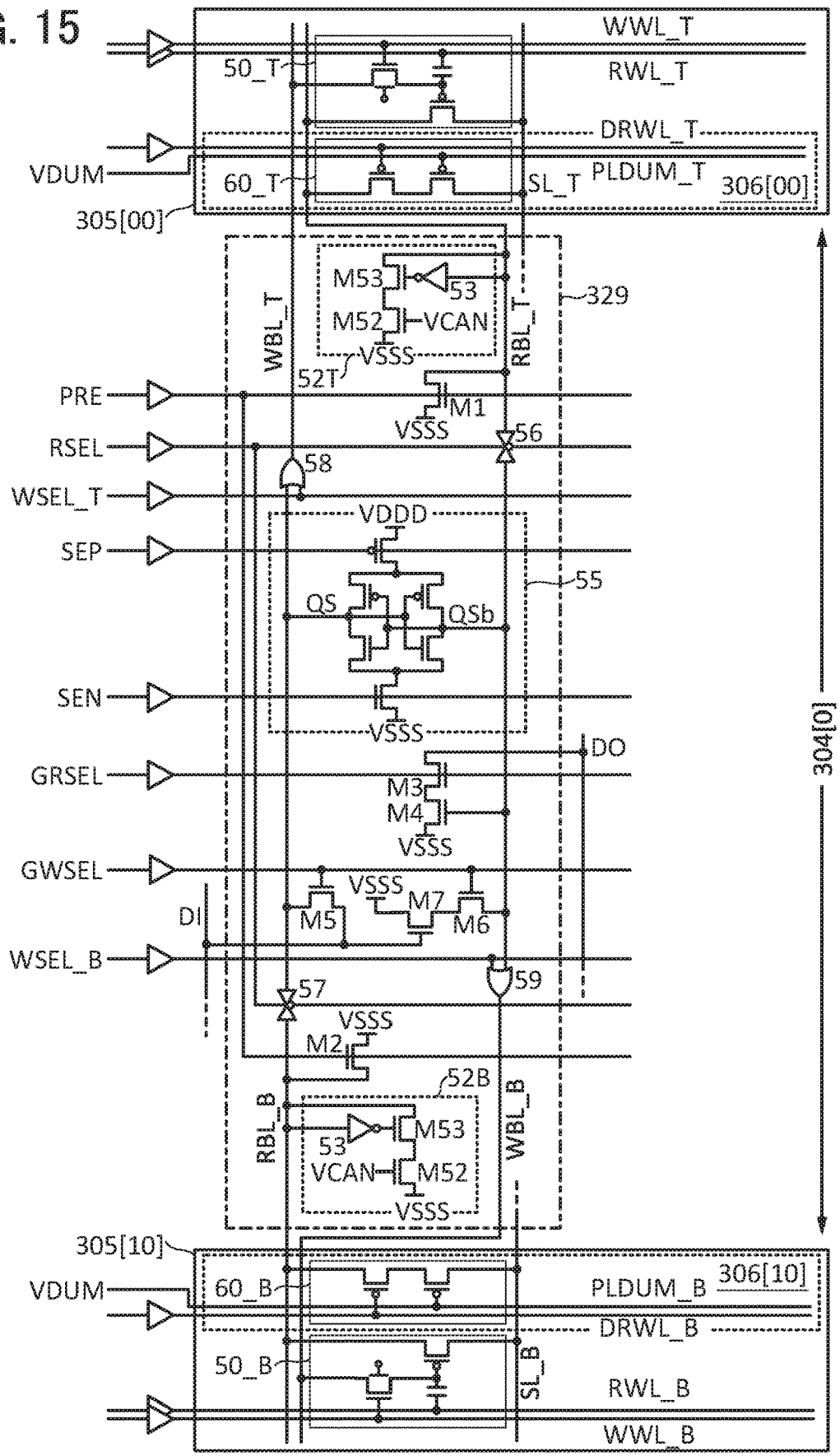
FIG. 15 is a circuit diagram illustrating a structure example of a column circuit.

Although FIG. 15 illustrates the circuit structure example in which the bit lines WBL_T and RBL_B are electrically connected to the node QS of the sense amplifier 55 and the bit lines WBL_B and RBL_T are electrically connected to the node QSb, the bit lines WBL_B and RBL_T may be electrically connected to the node QS and the bit lines WBL_T and RBL_B may be electrically connected to the node QSb.

The sense amplifier 55 functions as a latch circuit that stores data temporarily in write operation.

The sense amplifier 55 functions as a read circuit in read operation. When data is read from the block 305[00], the sense amplifier 55 judges whether the potential of the node QSb is data "0" or "1" using the potential of the node QS at the time of activation of the sense amplifier 55 as the potential VREF. In that case, the potential VREF is determined by current supplied from a replica cell 60_B to the bit line RBL_B.

When data is read from the block 305[10], the potential of the node QSb at the time of activation of the sense amplifier 55 is used as the potential VREF. In that case, the potential VREF is determined by current supplied from a replica cell 60_T to the bit line RBL_T.

(Output MUX 324)

The output MUX 324 has a function of reading the data DO[31:0] from the sense amplifier 323. The signal GRSEL [3:0] is a global read selection signal and controls the output MUX 324. The output MUX 324 is a multiplexer of 128 inputs and 32 outputs and has a function of selecting 32 sense amplifiers from 128 sense amplifiers. Data is read from the 32 sense amplifiers.

The transistors M3 and M4 are included in the output MUX 324. The circuits 329 in every four columns are electrically connected to a wiring for outputting the data DO[j]. For example, circuits 329[0] to 329[3] are electrically connected to a wiring for outputting the data D0[0].

(Write Driver 325)

The write driver 325 has a function of writing the data DI[31:0] to the sense amplifier 323. The write driver 325 writes data in byte units, half-word units, or word units in response to the signal GWSEL[15:0]. The signal GWSEL [15:0] is a global write selection signal.

The transistors M5 to M7 are included in the write driver 325. The circuits 329 in every four columns are electrically connected to a common wiring for inputting the data DI[j]. For example, the circuits 329[0] to 329[3] are electrically connected to a wiring for inputting the data DI[0].

(Source Line Driver 326)

The source line driver 326 drives the source line SL.

<Operation Example of NOSRAM 300>

An operation example of the NOSRAM 300 is described with reference to timing charts in FIG. 16 and FIG. 17.

<Read Operation>

Figure 16:
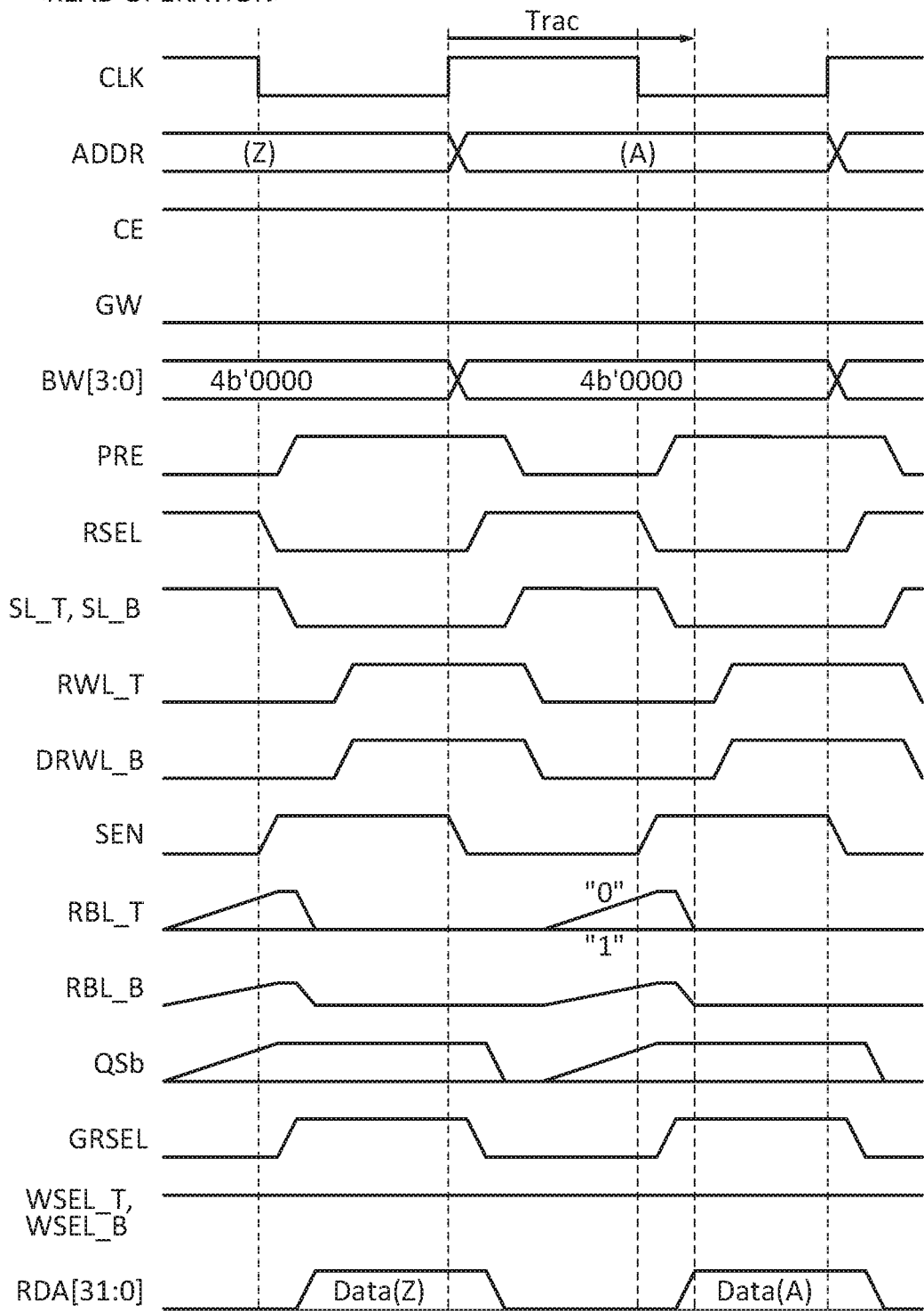
FIG. 16 is a timing chart illustrating an example of read operation of a NOSRAM.

FIG. 16 is a timing chart of read operation in which the block 305 [00] is accessed. The addresses (Z) and (A) are input for different clock cycles, and the data (Z) and (A) are read from the cells 50_T specified by the addresses (Z) and (A), respectively. Trac represents read access time. Here, the read operation is described focusing on the address (A).

The NOSRAM 300 performs the read operation while the signals CE, GW, and BW[3:0] are "1," "0," and "0000," respectively (Table 2).

Since the signal RPE is "H," the bit lines RBL_T and RBL_B are precharged to the potential VSSS. The signal RSEL is set to "H" to establish electrical continuity between the bit line RBL_T and the node QSb and between the bit line RBL_B and the node QS. As a result, the nodes QS and QSb are also precharged to the potential VSSS. The signal PRE is set to "L" to stop the precharge of the bit lines RBL_T and RBL_B. At the same time as the precharge stop, source lines SL_T and SL_B are charged to the potential VDDD.

Next, word lines RWL_T and DRWL_B are set to "L." Whether the bit line RBL_T is charged or holds the precharge potential (VSSS) depends on the potential of the node SN of the cell 50_T. The bit line RBL_B is charged by the replica cell 60_B.

Note that in the read operation, the signals WSEL_T and WSEL_B are kept at "H."

The signal RSEL is set to "L" to break electrical continuity between the bit line RBL_T and the node QSb and between the bit line RBL_B and the node QS. At the same time as the signal RSEL is set to "L," the signals SEN and SEP are set to "H" and "L," respectively, and the sense amplifier 55 is activated to reach the nodes QS and QSb full swing. At activation of the sense amplifier 55, when the potential of the node QS is higher than the potential of the node QSb, the potential of the node QSb/QS is VSSS/VDDD. When the potential of the node QS is lower than the potential of the node QSb, the potential of the node QSb/QS is VDDD/VSSS. The data reading principle of the sense amplifier 55 is described below with reference to FIG. 18.

Figure 18:
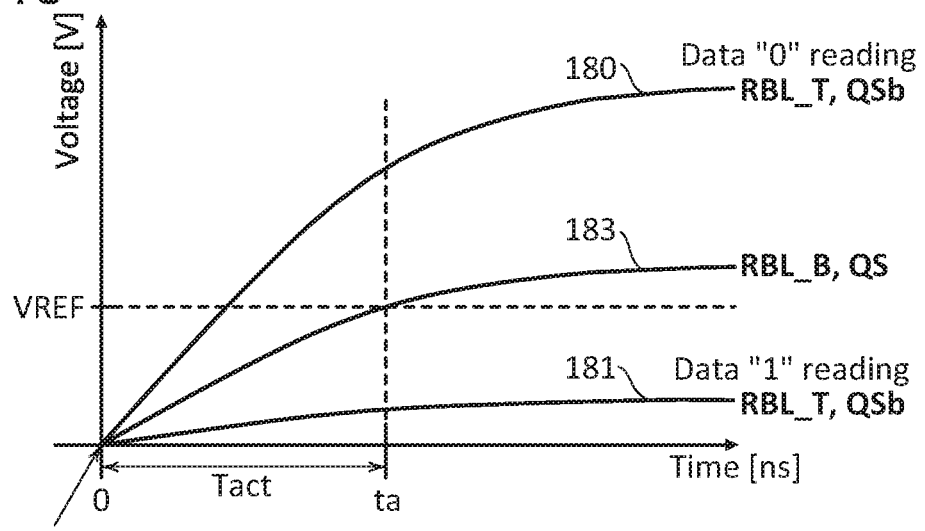
FIG. 18 illustrates an example of a method for detecting data read by a bit line.

FIG. 18 schematically shows potential changes of the bit lines RBL_T and RBL_B from the time when the word lines RWL_T and DRWL_B are set to "L."

In FIG. 18, time ta represents time at which the sense amplifier 55 is activated, and Tact represents time from selection of the word line RWL_T to activation of the sense amplifier 55. A curve 180 shows a potential change of the bit line RBL_T when data "0" is read. A curve 181 shows a potential change of the bit line RBL_T when data "1" is read. A curve 183 shows a potential change of the bit line RBL_B. Note that when the word lines RWL_T and DRWL_B are set to "L," electrical continuity is established between the bit line RBL_T and the node QSb and between the bit line RBL_B and the node QS; thus, the curves 180 and 181 each show a potential change of the node QSb, and the curve 183 shows a potential change of the node QS.

The sense amplifier 55 judges whether data read from the cell 50_T is "0" or "1" from the magnitude relationship between the potential of the bit line RBL_T and the potential of the bit line RBL_B at the time ta. In other words, the potential of the bit line RBL_B at the time ta corresponds to the read judge potential (VREF). In the example of FIG. 18, the sense amplifier 55 outputs the data "0" from the node QSb when the potential of the bit line RBL_T is higher than VREF, and the sense amplifier 55 outputs the data "1" from the node QSb when the potential of the bit line RBL_T is lower than VREF.

When the signal GRSEL is set to "H" after the sense amplifier 55 is activated, the data (A) is output from the column circuit 304[0] to the control circuit 301. The control circuit 301 outputs the data (A) as RDA[31:0] from the NOSRAM 300.

The word lines RWL_T and DRWL_B are set to "H." Then, the signals SEN and SEP are set to "L" and "H," respectively, to deactivate the sense amplifier 55. Next, the signal GRSEL is set to "L" to finish the read operation.

The replica cell 60 included in the NOSRAM 300 generates read judge potential, which can increase the resistance to PVT variations of the NOSRAM 300. This is understood by comparison between the NOSRAM 300 and the structure example in which the read judge potential is fixed potential input from the outside.

When the transistor characteristics of the NOSRAM are varied or the temperature environment is changed, the curves 180 and 181 in FIG. 18 are changed. In the case where the read judge potential is fixed, it is necessary to determine the time Tact assuming that the transistor characteristics are poorer than the specification. Therefore, the time Tact is increased when the margin for the charge time of the bit line RBL is considered. As a result, owing to the fixed read judge potential (e.g., VDDD/2), signal control is easy but reading speed is limited.

In contrast, read judge potential is generated inside the NOSRAM 300, so that the read judge potential can follow a variation in transistor characteristics and a change in temperature. For example, the value of the read judge potential can be decreased when the transistor characteristics are at a slow process corner, while the value of the read judge potential can be increased when the transistor characteristics are at a fast process corner.

The read judge potential of the NOSRAM 100 can be optimized by adjustment of the size (typically, channel length L and channel width W) of the transistors MD2 and MD3 of the replica cell 60 and the value of the potential VDUM. Examples are shown below.

The channel length L and channel width W of the transistor MD2 are the same as those of the transistor MP2 of the cell 50. When the specifications of the transistors MD2 and MP2 are the same, design and manufacturing process are facilitated.

The value of the potential VDUM is determined in consideration of the threshold voltage of the transistor MD2. For example, the value of the potential VDUM is a value between the potential of data "0" (VSSS) and the potential of data "1" (VDDD).

The current drive capability of the transistor MD3 is higher than that of the transistor MD2. This is because the charge time of the bit line RBL_B (or RBL_T) in the read operation is determined depending on the current drive capability of the transistor MD2. As a result, a potential change of the bit line RBL_B (or RBL_T) in the read operation can be easily controlled by the value of the potential VDUM. To increase the current drive capability of the transistor MD3, for example, the channel width W of the transistor MD3 is set larger than that of the transistor MD2.

The size of the transistors MD2 and MD3 and the determination method of the potential VDUM are not limited to the above. The size of the transistors MD2 and MD3 and the potential VDUM are preferably determined so that in the read operation, the potential of the bit line RBL_B (or RBL_T) changes while being a value between the potential of the bit line RBL_T (or RBL_B) when data "0" is written and the potential of the bit line RBL_T (or RBL_B) when data "1" is written.

<Write Operation>

Figure 17:
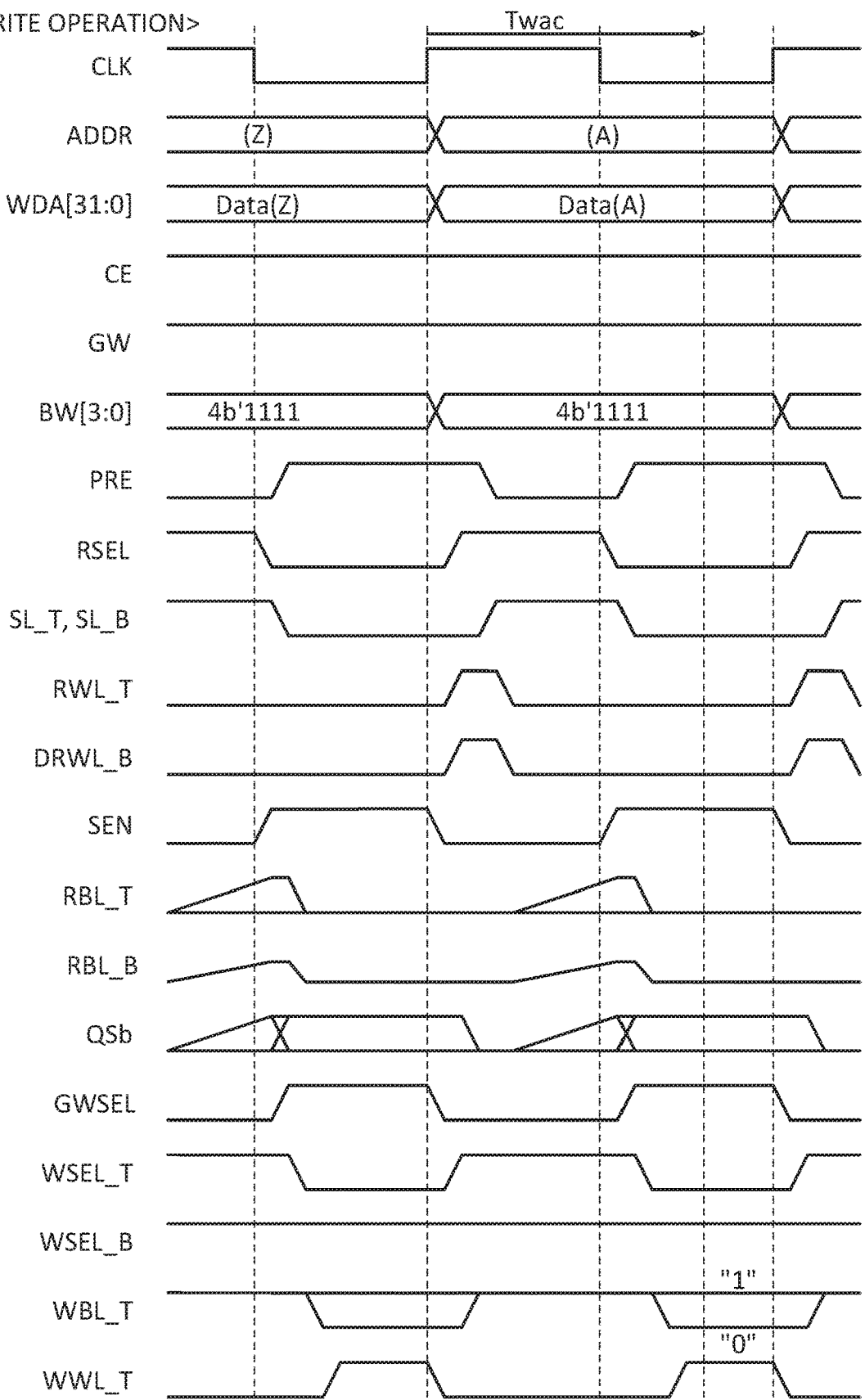
FIG. 17 is a timing chart illustrating an example of write operation of a NOSRAM.

FIG. 17 is a timing chart of write operation in which the block 305[00] is accessed. The different addresses (Z) and (A) and the data (Z) and (A) are input for clock cycles, and the data (Z) and (A) are written to the cells 50 specified by the addresses (Z) and (A), respectively. Twac represents write access time. Here, the write operation is described focusing on the address (A).

Since the signals CE, GW, and BW[3:0] are "1," "1," and "1111," respectively, the NOSRAM 300 performs the write operation.

The NOSRAM 300 supports partial write operation. While the signals WSEL_T and WSEL_B are "H," first, data is read from the cell 50_T in a write-target row to the sense amplifier 55. The read operation is similar to the read operation in FIG. 16. The node QSb is charged or holds the precharge potential (VSSS) depending on data of the cell 50_T. The node QS is charged by the replica cell 60_B.

Next, the signals SEN and SEP are set to "H" and "L," respectively, so that the sense amplifier 55 is activated. Then, the signal GWSEL is set to "H" to write the data DI to the node QS. Data of the sense amplifier 55 in a column selected by the signal GWSEL is updated by the data DI. Data of the sense amplifier 55 in an unselected column is not updated.

Next, the signal WSEL_T is set to "L" to write data based on the potential of the node QS to the bit line WBL_T. Then, a word line WWL_T is set to "H" to write data of the bit line WBL_T to the cell 50_T. The data of the cell 50_T in the selected column is updated by the data DI, and stored data is written back to the cell 50_T in the unselected column.

The signal GWSEL and the word line WWL_T are set to "L." Then, the signal SEN is set to "L" and the signals SEP and WSEL_T are set to "H" to finish the write operation.

<Replica Cell>

Figure 19A:
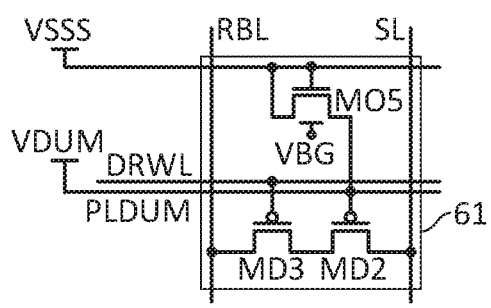
FIGS. 19A to 19C are circuit diagrams each illustrating a structure example of a replica cell.

A replica cell 61 in FIG. 19A is a modification example of the replica cell 60 and further includes a transistor MO5. The transistor MO5 is an OS transistor with a back gate. A gate and a first terminal of the transistor MO5 are electrically connected to a power supply line for supplying the potential VSSS. A second terminal of the transistor MO5 is electrically connected to a gate of the transistor MD2. A back gate of the transistor MO5 is electrically connected to the wiring BGL for supplying the potential VBG. The transistor MO5 corresponds to the read transistor MN5 in the cell 50. Thus, the transistor MO5 has the same specifications as the transistor MN5. When the transistor MO5 is included, the replica cell 61 has a circuit structure closer to the circuit structure of the cell 50 rather than the circuit structure of the replica cell 60.

Figure 19B:
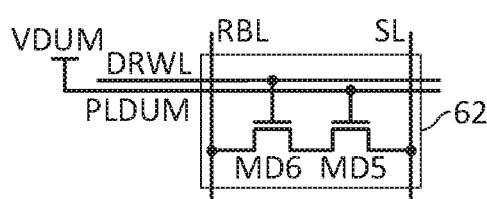
Figure 19C:
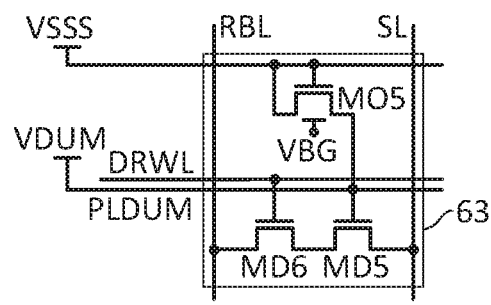

A replica cell 62 in FIG. 19B is a modification example of the replica cell 60 and includes n-channel transistors MD5 and MD6 instead of the transistors MD2 and MD3. A replica cell 63 in FIG. 19C is a modification example of the replica cell 61 and includes the transistors MD5 and MD6 instead of the transistors MD2 and MD3.

In the case where a memory cell array is formed using any of the cells 10 to 12 (in FIG. 1B, FIG. 1C, and FIG. 7A), a replica cell array includes the replica cell 60 or 61. Note that in the case where the cell 12 is used, the replica cell 60 or 61 is electrically connected to the wiring PLDDD instead of the source line SL.

In the case where a memory cell array is formed using any of the cells 13 and 14 (in FIG. 7B and FIG. 7C), a replica cell array may include the replica cell 62 or 63. In the case where the cell 14 is used, the replica cell 62 or 63 is electrically connected to the wiring PLSSS instead of the source line SL.

The NOSRAM in this embodiment can cancel leakage current that leaks from an unselected cell to a bit line by using the leakage current cancel circuit: Thus, a noise margin for the bit line can be improved and a data reading error can be reduced.

The potential VREF is generated by the replica cell in the NOSRAM in this embodiment; thus, the potential VREF can be optimized depending on transistor characteristics and environment temperature. As a result, read speed can be improved.

In the NOSRAM in this embodiment, operation of reading data from the memory cell to the sense amplifier is performed together with write operation. Consequently, the decrease in the time Tact can improve the operating frequency of the NOSRAM, especially the operating frequency of the NOSRAM in the worst case of a PVT corner.

<Increase in Capacity of NOSRAM>

An increase in capacity of the NOSRAM is described with reference to FIGS. 20A to 20C. The NOSRAM can perform partial write operation without a word line division circuit. Since the word line division circuit is not used, there is no increase in chip area and power consumption. Thus, the circuit structure of the NOSRAM in this embodiment is very effective in increasing the capacity.

Figure 20A:
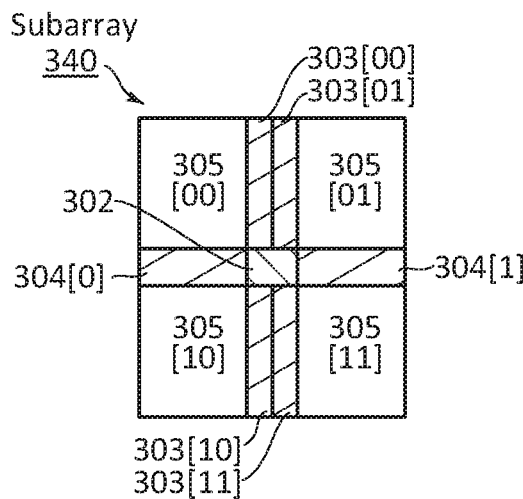
FIG. 20A is a block diagram illustrating a structure example of a subarray of a NOSRAM.

For example, the capacity of the NOSRAM can be increased by the unit of a subarray 340 in FIG. 20A. The subarray 340 includes one predecoder 302, four row circuits 303, two column circuits 304, and four blocks 305.

Figure 20B:
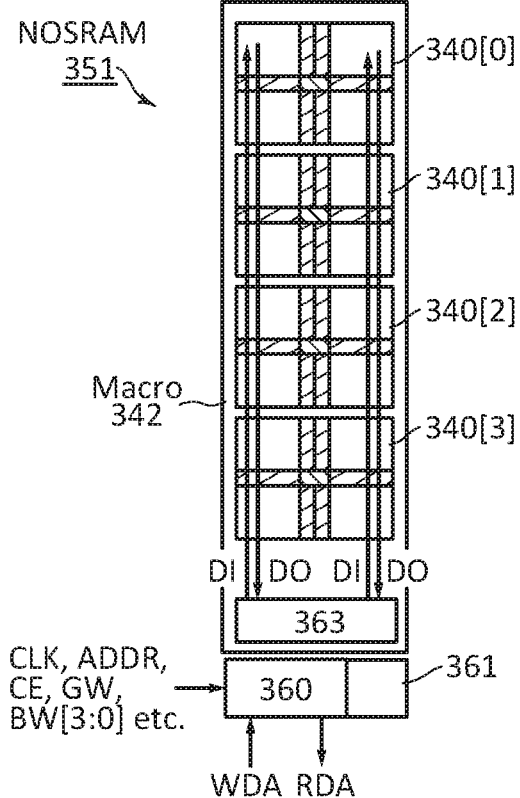
FIGS. 20B and 20C are block diagrams each illustrating a structure example of a NOSRAM.

A NOSRAM 351 in FIG. 20B includes subarrays 340[0] to 340[3], a control circuit 360, a predecoder 361, and a logic circuit 363. Like the control circuit 301, the control circuit 360 controls the NOSRAM 351 as a whole. The predecoder 361 has a function of decoding the signal ADDR and determining which subarray 340 to activate. The logic circuit 363 has a function of controlling input of the data DI and output of the data DO to and from the subarrays 340[0] to 340[3].

Figure 20C:
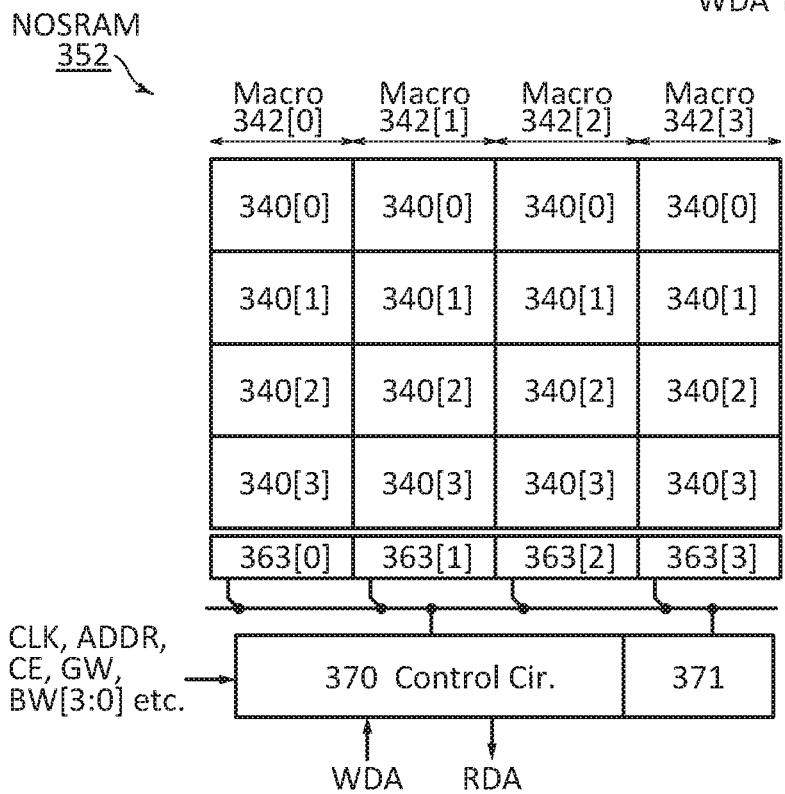

The capacity of the NOSRAM can be increased by the unit of a functional block (referred to as a macro 342) including the subarrays 340[0] to 340[3] and the logic circuit 363, as illustrated in an example of FIG. 20C.

A NOSRAM 352 in FIG. 20C includes four macros 342[0] to 342[3], a control circuit 370, and a predecoder 371. Like the control circuit 301, the control circuit 370 controls the NOSRAM 352 as a whole. The predecoder 371 has a function of decoding the signal ADDR and determining which macro 342 to activate.

Since the capacity of the subarray 340 is 8 kB (128 rows×128 columns×4 blocks), the capacities of the NOSRAMs 351 and 352 are 32 kB and 128 kB, respectively.

Embodiment 4

Any of the storage devices described in Embodiments 1 to 3 can be used as a storage device in any of a variety of electronic components or electronic devices.

For example, any of the storage devices described in Embodiments 1 to 3 can be incorporated into any of a variety of processors such as a microcontroller unit (MCU), an FPGA, a CPU, a GPU, and an application processor (AP). Alternatively, any of the storage devices described in Embodiments 1 to 3 can be incorporated into any of a variety of ICs such as a wireless IC, a display controller IC, a source driver IC, and an image decoder IC.

The NOSRAM can have performance comparable to that of an SRAM, a DRAM, or a flash memory. Since the NOSRAM can retain data for a long time, when the storage devices described in Embodiments 1 to 3 are NOSRAMs, any of the storage devices described in Embodiments 1 to 3 can be incorporated into any of a variety of electronic components or electronic devices as a nonvolatile storage device.

Here, an MCU is described as an example of a semiconductor device including a NOSRAM.

<MCU 400>

Figure 21:
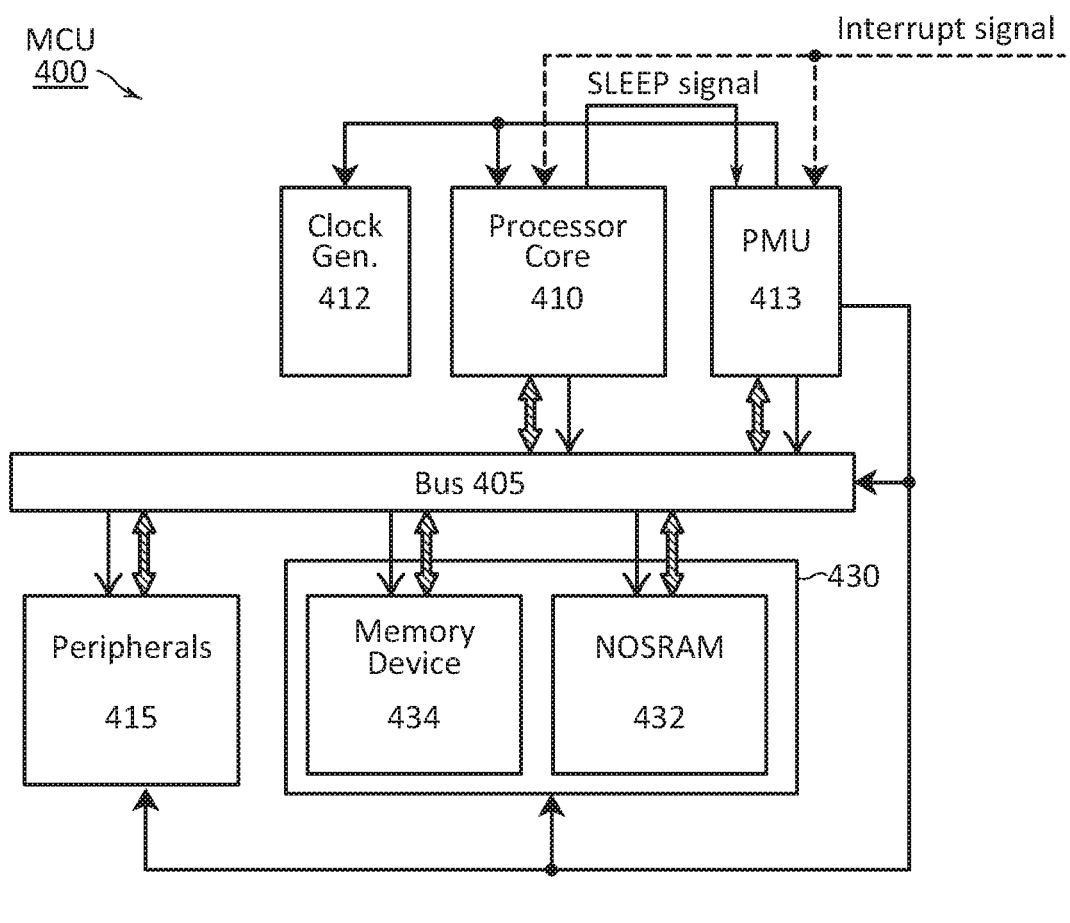
FIG. 21 is a block diagram illustrating a structure example of a microcontroller unit.

FIG. 21 illustrates a structure example of a microcontroller unit (MCU). An MCU 400 in FIG. 21 includes a bus 405, a processor core 410 (hereinafter referred to as a core 410), a clock generation circuit 412, a power management unit (PMU) 413, a peripheral circuit (Peripherals) 415, and a memory portion 430. The MCU 400 is a semiconductor device that is integrated into one chip.

The core 410 exchanges data with the PMU 413, the peripheral circuit 415, and the memory portion 430 through the bus 405. A control signal from the core 410 is input to the bus 405. The bus 405 transmits the control signal to a circuit block to be controlled. Examples of the control signal include an enable signal and an address signal.

The clock generation circuit 412 generates a clock signal that is used in the MCU 400.

There is no particular limitation on the function of the peripheral circuit 415. In the peripheral circuit 415, a variety of functional circuits are provided depending on the use of the MCU 400. Examples of the functional circuits include a power supply circuit, a timer device, an interrupt controller, an input/output port, an analog-digital converter, a comparator, and an operational amplifier.

The memory portion 430 includes a NOSRAM 432 and a storage device 434. The memory portion 430 may include a plurality of hierarchical NOSRAMs 432. For example, as for a high-level NOSRAM, storage capacitance of a memory cell is reduced and accordingly retention time is decreased but write time is shortened. As for a low-level NOSRAM, storage capacitance of a memory cell is increased, retention time is increased, and memory capacity is increased.

The storage device 434 can be any storage device as long as it is a rewritable memory. Examples of such a memory include a DRAM, an SRAM, a flash memory, a ferroelectric RAM (FeRAM), a magnetoresistive RAM (MRAM), a resistive RAM (ReRAM), and a phase-change RAM (PRAM).

The memory portion 430 does not necessarily include the storage device 434. Alternatively, the memory portion 430 may include a plurality of storage devices 434. The storage devices 434 included in the memory portion 430 may be an SRAM and a flash memory, for example. In addition, the memory portion 430 may include a read-only memory (ROM).

The PMU 413 has a function of controlling power gating. The PMU 413 generates a power gating control signal on the basis of a sleep (SLEEP) signal transmitted from the core 410, an interrupt signal input from the outside, and the like. The generated power gating control signal is transmitted to circuits in the MCU 400, for example, the bus 405 and the core 410. Each circuit executes power gating sequence in response to the power gating control signal. The NOSRAM 432 can perform power-off operation without backup operation because it is a nonvolatile RAM.

<Example of Method for Manufacturing Electronic Component>

Figure 22A:
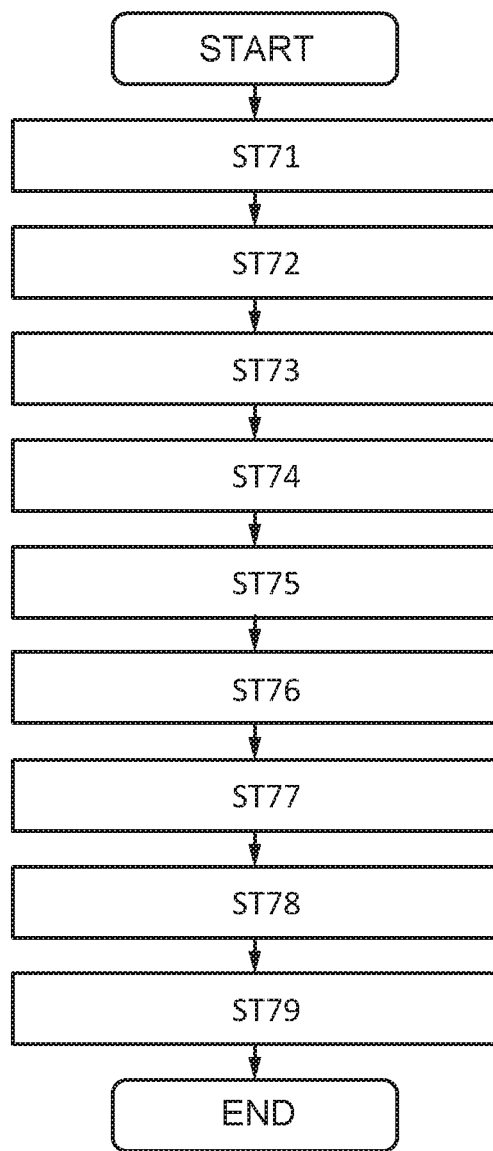
FIG. 22A is a flow chart illustrating a method for manufacturing an electronic component.

FIG. 22A is a flow chart showing an example of a method for manufacturing an electronic component. The electronic component is also referred to as a semiconductor package or an IC package.

A semiconductor device including a transistor is completed by integrating detachable components on a printed circuit board through an assembly process (post-process). The post-process can be finished through steps in FIG. 22A. In a pre-process, first, a semiconductor device in one embodiment of the present invention and the like are provided on a semiconductor wafer (e.g., a silicon wafer).

In the post-process, first, a rear-surface grinding step in which a rear surface of the semiconductor wafer (a surface on which a semiconductor device and the like are not formed) is ground is performed (Step ST71). This step aims to reduce the size of the electronic component by thinning the semiconductor wafer through grinding. After Step ST71, a dicing step of separating the semiconductor wafer into a plurality of chips is performed (Step ST72). In the dicing step, the semiconductor wafer is cut along dicing lines, so that chips are cut out from the semiconductor wafer.

A die bonding step in which the separated chips are separately picked out and bonded on a lead frame is performed (Step ST73). In the die bonding step, the chip may be bonded to the lead frame by an appropriate method depending on a product, for example, with resin or tape. The chip may be bonded to an interposer substrate instead of the lead frame.

Next, a wire bonding step of electrically connecting a lead of the lead frame and an electrode on the chip with a metal fine line (wire) is performed (Step ST74). A silver line, a gold line, or the like can be used as the metal fine line. For wire bonding, ball bonding or wedge bonding can be employed, for example. A wire-bonded chip 7110 is subjected to a molding step of sealing the chip with epoxy resin or the like (Step ST75).

The lead of the lead frame is plated in a lead plating step (Step ST76). Then, the lead is cut and processed into a predetermined shape in a formation step (Step ST77). A printing (marking) step is performed on a surface of the package (Step ST78). After an inspection step (Step ST79) for checking whether an external shape is acceptable and whether there is a malfunction, for example, the electronic component is completed.

Figure 22B:
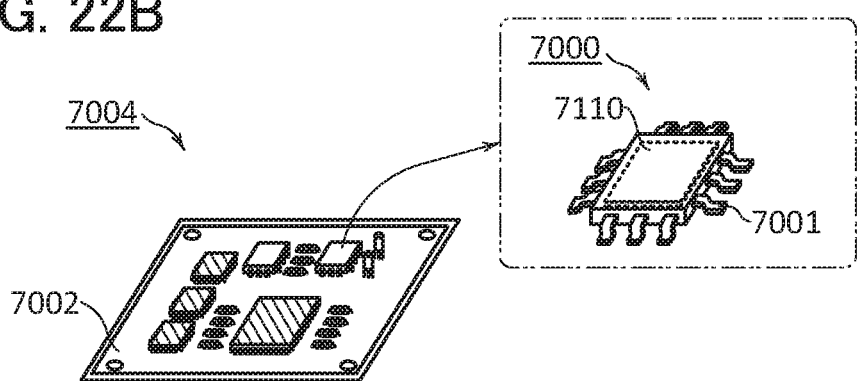
FIG. 22B is a schematic view illustrating a structure example of an electronic component.

FIG. 22B is a schematic perspective view of the completed electronic component. The electronic component has a plurality of standards and names depending on a terminal extraction direction and a terminal shape. FIG. 22B illustrates a quad flat package (QFP) as an example of the electronic component.

An electronic component 7000 in FIG. 22B includes a lead 7001 and the chip 7110. The chip 7110 includes any of the storage devices in this embodiment or a processor including the storage device.

The electronic component 7000 may include a plurality of chips 7110. The electronic component 7000 is mounted on a printed circuit board 7002, for example. A plurality of electronic components 7000 are combined and electrically connected to each other over the printed circuit board 7002; thus, a circuit board on which the electronic components are mounted (a circuit board 7004) is completed. The circuit board 7004 is provided in an electronic device or the like.

The electronic component 7000 includes a low-power semiconductor device; thus, implementation of the electronic component 7000 in an electronic device can reduce the power consumption of the electronic device. Next, electronic devices each including the electronic component are described.

Figure 23A:
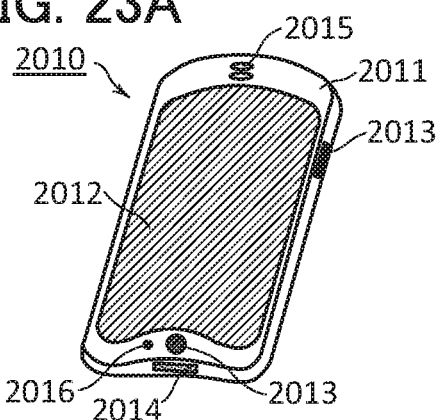
FIGS. 23A to 23F each illustrate a structure example of an electronic device.

An information terminal 2010 in FIG. 23A includes a display portion 2012 incorporated into a housing 2011, an operation button 2013, an external connection port 2014, a speaker 2015, and a microphone 2016. Here, a display region of the display portion 2012 is curved. The information terminal 2010 is a portable information terminal driven with a battery and can be used as a tablet information terminal or a smartphone. The information terminal 2010 has functions such as phone calls, e-mailing, an appointment organizer, Internet communication, and music reproduction. Information can be input by touching the display portion 2012 with a finger or the like. Various operations such as making a phone call, inputting characters, and screen switching of the display portion 2012 can be performed by touching the display portion 2012 with a finger or the like. The information terminal 2010 can be operated by inputting sound from the microphone 2016. Various operations such as power on/off operation and screen switching of the display portion 2012 can be performed by pressing the operation button 2013.

Figure 23B:
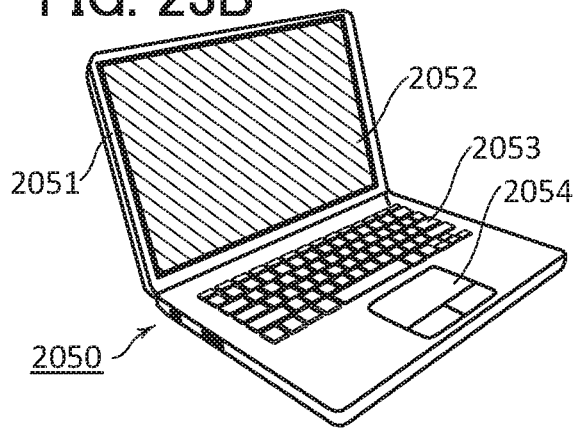

A laptop 2050 in FIG. 23B includes a housing 2051, a display portion 2052, a keyboard 2053, and a pointing device 2054. The laptop 2050 can be operated by touch operation of the display portion 2052.

Figure 23C:
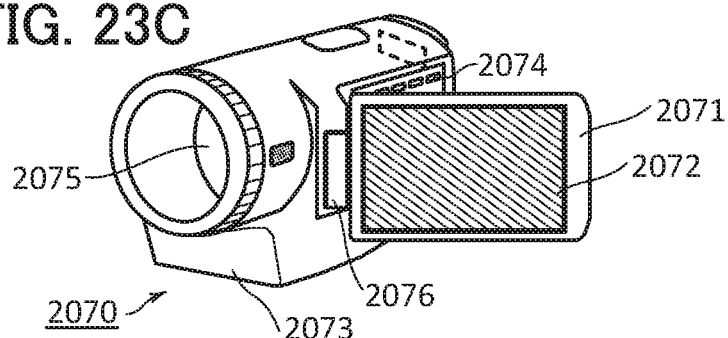

A video camera 2070 in FIG. 23C includes a housing 2071, a display portion 2072, a housing 2073, an operation key 2074, a lens 2075, and a joint 2076. The display portion 2072 is provided in the housing 2071. The operation key 2074 and the lens 2075 are provided in the housing 2073. The housing 2071 and the housing 2073 are connected to each other with the joint 2076, and the angle between the housing 2071 and the housing 2073 can be changed with the joint 2076. Images on the display portion 2072 may be switched in accordance with the angle between the housing 2071 and the housing 2073 at the joint 2076. Various operations such as starting or stopping video recording, magnification and zoom adjustment, and changing a shooting range can be performed by touch operation of the display portion 2072.

Figure 23D:
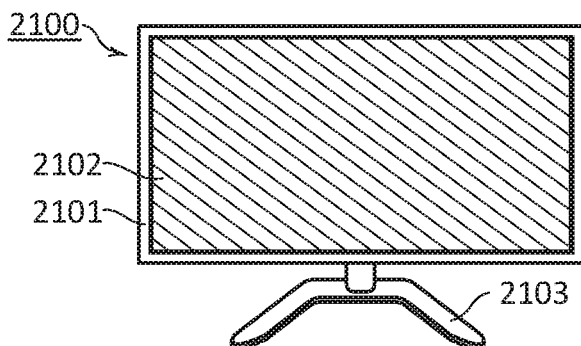

A display device 2100 in FIG. 23D includes a housing 2101, a display portion 2102, and a support 2103. The display device 2100 can be used as a monitor for a computer, a game machine, or the like. When a receiver for television (TV) broadcasting is incorporated into the display device 2100, the display device 2100 can be used as a television receiver.

Figure 23E:
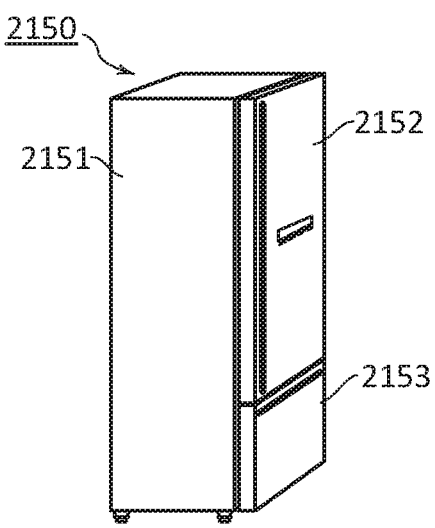

For example, any of the storage devices described in Embodiments 1 to 3 is incorporated into an MCU for consumer electronics. FIG. 23E illustrates an example of consumer electronics. An electric refrigerator-freezer 2150 in FIG. 23E includes a housing 2151, a refrigerator door 2152, a freezer door 2153, and the like.

Figure 23F:
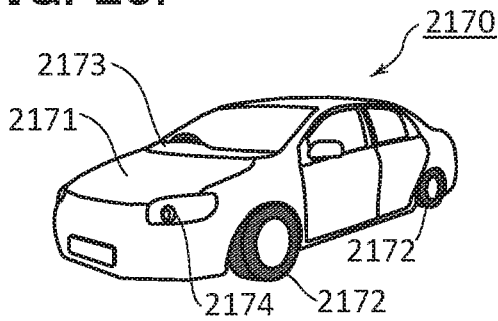

For example, any of the storage devices described in Embodiments 1 to 3 is incorporated into an automotive MCU. FIG. 23F illustrates an example of a motor vehicle. A motor vehicle 2170 in FIG. 23F includes a car body 2171, wheels 2172, a dashboard 2173, lights 2174, and the like.

Embodiment 5

In this embodiment, a semiconductor device including a Si transistor and an OS transistor is described. The structure of such a semiconductor device is described here using the NOSRAM 300 described in Embodiment 3 as an example.

<Stacked Structure of NOSRAM>

Figure 24:
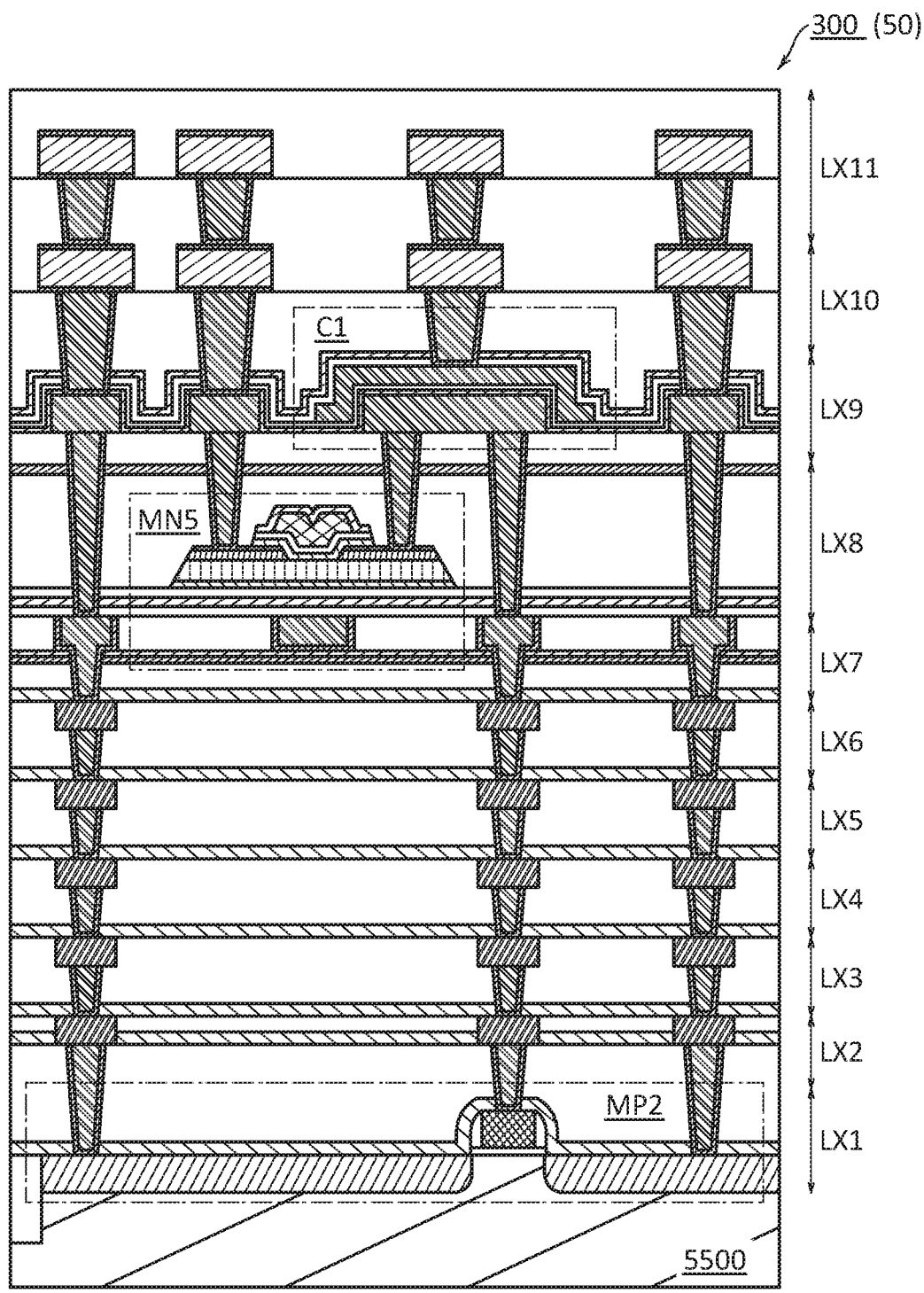
FIG. 24 is a cross-sectional view illustrating a stacked structure of a NOSRAM.

The structure of the NOSRAM 300 is described with reference to FIG. 24. FIG. 24 shows a cross-sectional structure of the cell 50 as a typical example. The NOSRAM 300 includes a single crystal silicon wafer 5500 and a stack of layers LX1 to LX11. The layers LX1 to LX11 include wirings, electrodes, plugs, and the like.

In the layer LX1, a Si transistor included in the NOSRAM 300, such as the transistor MP2, is provided. A channel formation region of the Si transistor is provided in the single crystal silicon wafer 5500.

The layer LX8 includes an OS transistor such as the transistor MN5. A back gate electrode of the OS transistor is provided in the layer LX7. The OS transistor here has a structure similar to an OS transistor 5001 to be described later (see FIG. 26A).

Figure 25:
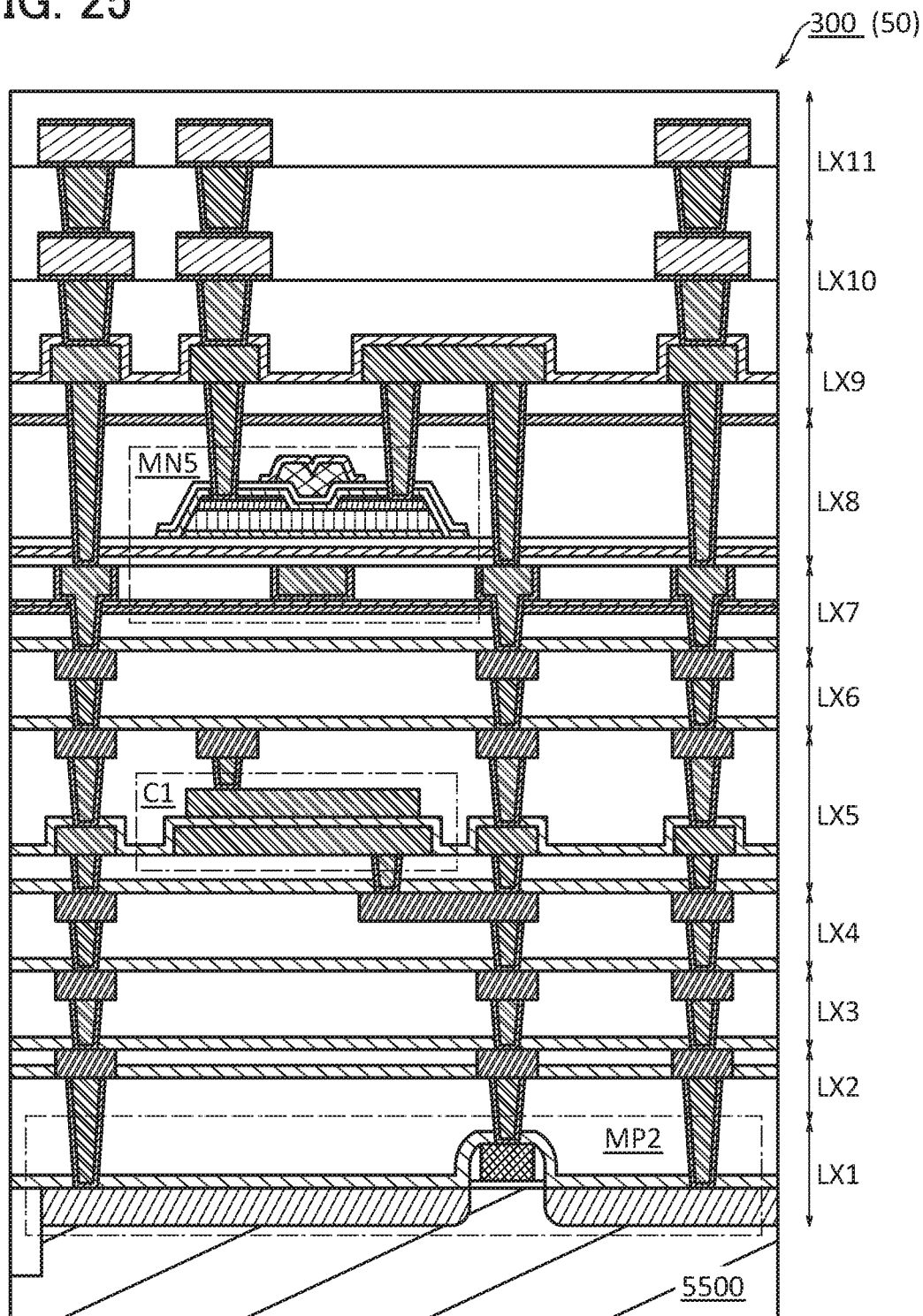
FIG. 25 is a cross-sectional view illustrating a stacked structure of a NOSRAM.

The layer LX9 includes the capacitor C1. The capacitor C1 can be provided below the layer LX7, as shown in an example of FIG. 25. The capacitor C1 is provided in the layer LX5 in FIG. 25. In FIG. 25, the OS transistor provided in the layer LX8 has a structure similar to an OS transistor 5002 to be described later (see FIG. 26B).

Note that FIG. 24 and FIG. 25 are not cross-sectional views of the NOSRAM 300 taken along a specific line but cross-sectional views for illustrating examples of the stacked structure of the NOSRAM 300. Next, structure examples of the OS transistor are described with reference to FIGS. 26A and 26B and FIG. 27.

<Structure Example 1 of OS Transistor>

Figure 26A:
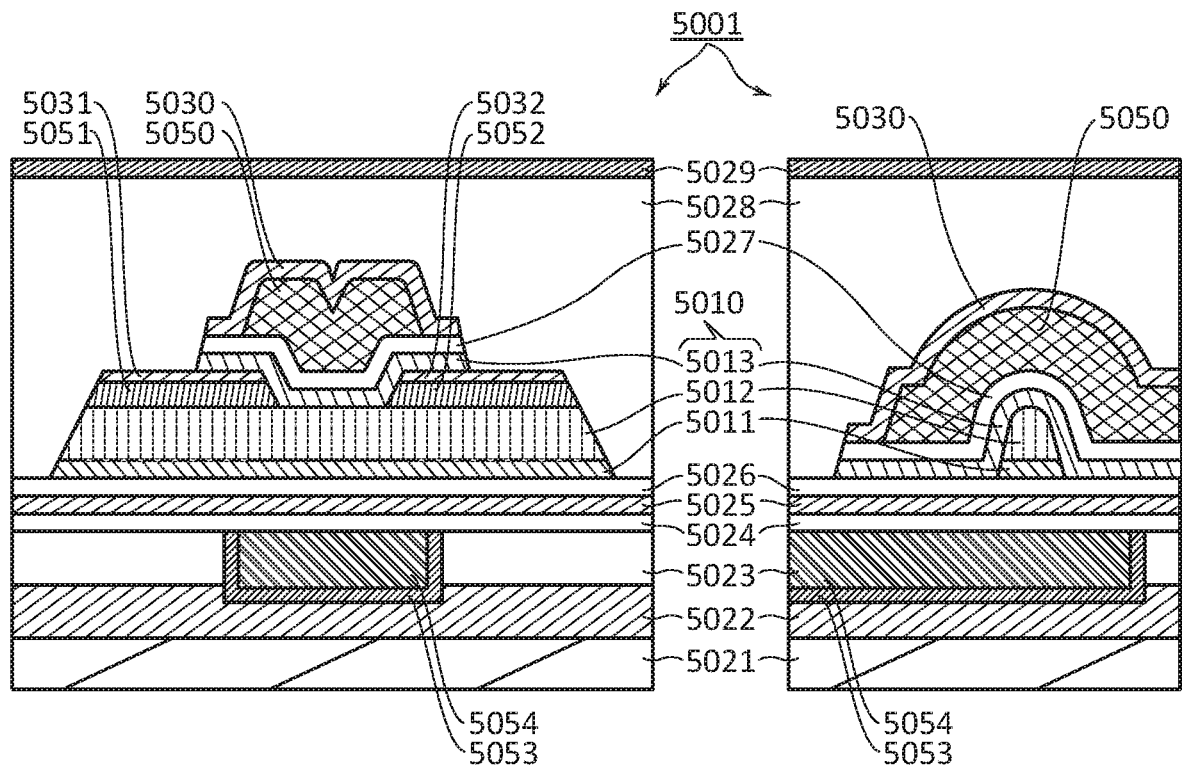
FIGS. 26A and 26B are cross-sectional views each illustrating a structure example of an OS transistor.

FIG. 26A illustrates a structure example of an OS transistor. The OS transistor 5001 in FIG. 26A is a metal oxide transistor. A cross-sectional view of the OS transistor 5001 in a channel length direction is illustrated on the left drawing of FIG. 26A, and a cross-sectional view of the OS transistor 5001 in a channel width direction is illustrated on the right drawing of FIG. 26A.

The OS transistor 5001 is formed over an insulating surface, here, over an insulating layer 5021. The OS transistor 5001 is covered with insulating layers 5028 and 5029. The OS transistor 5001 includes insulating layers 5022 to 5027 and 5030 to 5032, metal oxide layers 5011 to 5013, and conductive layers 5050 to 5054.

Note that an insulating layer, a metal oxide layer, a conductor, and the like in a drawing may have a single-layer structure or a stacked structure. These elements can be formed by any of a variety of deposition methods such as sputtering, molecular beam epitaxy (MBE), pulsed laser ablation (PLA), CVD, and atomic layer deposition (ALD). Examples of CVD include plasma-enhanced CVD, thermal CVD, and metal organic CVD.

The metal oxide layers 5011 to 5013 are collectively referred to as an oxide layer 5010. As illustrated in FIG. 26A, the oxide layer 5010 includes a portion where the metal oxide layer 5011, the metal oxide layer 5012, and the metal oxide layer 5013 are stacked in that order. When the OS transistor 5001 is on, a channel is mainly formed in the metal oxide layer 5012 of the oxide layer 5010.

A gate electrode of the OS transistor 5001 is formed using the conductive layer 5050. A pair of electrodes that functions as a source electrode and a drain electrode of the OS transistor 5001 is formed using the conductive layers 5051 and 5052. The conductive layers 5050 to 5052 are covered with the insulating layers 5030 to 5032 that function as barrier layers. A back gate electrode of the OS transistor 5001 is formed using a stack of the conductive layers 5053 and 5054. The OS transistor 5001 does not necessarily include a back gate electrode. The same applies to an OS transistor 5002 to be described later.

A gate insulating layer on a gate (front gate) side is formed using the insulating layer 5027. A gate insulating layer on a back gate side is formed using a stack of the insulating layers 5024 to 5026. The insulating layer 5028 is an interlayer insulating layer. The insulating layer 5029 is a barrier layer.

The metal oxide layer 5013 covers a stack of the metal oxide layers 5011 and 5012 and the conductive layers 5051 and 5052. The insulating layer 5027 covers the metal oxide layer 5013. The conductive layers 5051 and 5052 each include a region that overlaps with the conductive layer 5050 with the metal oxide layer 5013 and the insulating layer 5027 positioned therebetween.

Examples of a conductive material used for the conductive layers 5050 to 5054 include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing the above metal as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

For example, the conductive layer 5050 is a single layer of tantalum nitride or tungsten. Alternatively, in the case where the conductive layer 5050 has a two-layer structure or a three-layer structure, the following combinations can be used: aluminum and titanium; titanium nitride and titanium; titanium nitride and tungsten; tantalum nitride and tungsten; tungsten nitride and tungsten; titanium, aluminum, and titanium; titanium nitride, aluminum, and titanium; and titanium nitride, aluminum, and titanium nitride. The conductor described first is used for a layer on the insulating layer 5027 side.

The conductive layers 5051 and 5052 have the same layer structure. For example, in the case where the conductive layer 5051 is a single layer, any of metals such as aluminum, titanium, chromium, nickel, copper, yttrium, zirconium, molybdenum, silver, tantalum, and tungsten, or an alloy containing any of these metals as its main component may be used. Alternatively, in the case where the conductive layer 5051 has a two-layer structure or a three-layer structure, the following combinations can be used: titanium and aluminum; tungsten and aluminum; tungsten and copper; a copper-magnesium-aluminum alloy and copper; a titanium film and copper; titanium or titanium nitride, aluminum or copper, and titanium or titanium nitride; and molybdenum or molybdenum nitride, aluminum or copper, and molybdenum or molybdenum nitride. The conductor described first is used for a layer on the insulating layer 5027 side.

For example, it is preferable that the conductive layer 5053 have a hydrogen barrier property (e.g., a tantalum nitride layer) and that the conductive layer 5054 have higher conductivity than the conductive layer 5053 (e.g., tungsten). With such a structure, a stack of the conductive layer 5053 and the conductive layer 5054 functions as a wiring and has a function of suppressing diffusion of hydrogen into the oxide layer 5010.

Examples of insulating materials used for the insulating layers 5021 to 5032 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 5021 to 5030 are formed using a single-layer structure or a stacked structure of these insulating materials. The layers used for the insulating layers 5021 to 5030 may include a plurality of insulating materials.

Note that in this specification and the like, an oxynitride refers to a substance that contains more oxygen than nitrogen, and a nitride oxide refers to a substance that contains more nitrogen than oxygen.

In the OS transistor 5001, the oxide layer 5010 is preferably surrounded by an insulating layer with oxygen and hydrogen barrier properties (hereinafter such an insulating layer is referred to as a barrier layer). With such a structure, it is possible to suppress the release of oxygen from the oxide layer 5010 and entry of hydrogen into the oxide layer 5010; thus, the reliability and electrical characteristics of the OS transistor 5001 can be improved.

For example, the insulating layer 5029 functions as a barrier layer and at least one of the insulating layers 5021, 5022, and 5024 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride. A barrier layer may be provided between the oxide layer 5010 and the conductive layer 5050. Alternatively, a metal oxide layer that has oxygen and hydrogen barrier properties may be provided as the metal oxide layer 5013.

The insulating layer 5030 is preferably a barrier layer that prevents oxidation of the conductive layer 5050. When the insulating layer 5030 has an oxygen barrier property, oxidation of the conductive layer 5050 due to oxygen released from the insulating layer 5028 or the like can be suppressed. For example, the insulating layer 5030 can be formed using a metal oxide such as aluminum oxide.

A structure example of the insulating layers 5021 to 5032 is described. In this example, each of the insulating layers 5021, 5022, 5025, and 5029 to 5032 functions as a barrier layer. The insulating layers 5026 to 5028 are oxide layers containing excess oxygen. The insulating layer 5021 is formed using silicon nitride. The insulating layer 5022 is formed using aluminum oxide. The insulating layer 5023 is formed using silicon oxynitride. The gate insulating layers (5024 to 5026) on the back gate side are formed using a stack of silicon oxide, aluminum oxide, and silicon oxide. The gate insulating layer (5027) on the front gate side is formed using silicon oxynitride. The interlayer insulating layer (5028) is formed using silicon oxide. The insulating layers 5029 to 5032 are formed using aluminum oxide.

FIG. 26A illustrates an example in which the oxide layer 5010 has a three-layer structure; however, one embodiment of the present invention is not limited thereto. For example, the oxide layer 5010 can have a two-layer structure without the metal oxide layer 5011 or 5013 or may be composed of one of the metal oxide layers 5011 and 5012. Alternatively, the oxide layer 5010 may be composed of four or more metal oxide layers.

<Structure Example 2 of OS Transistor>

Figure 26B:
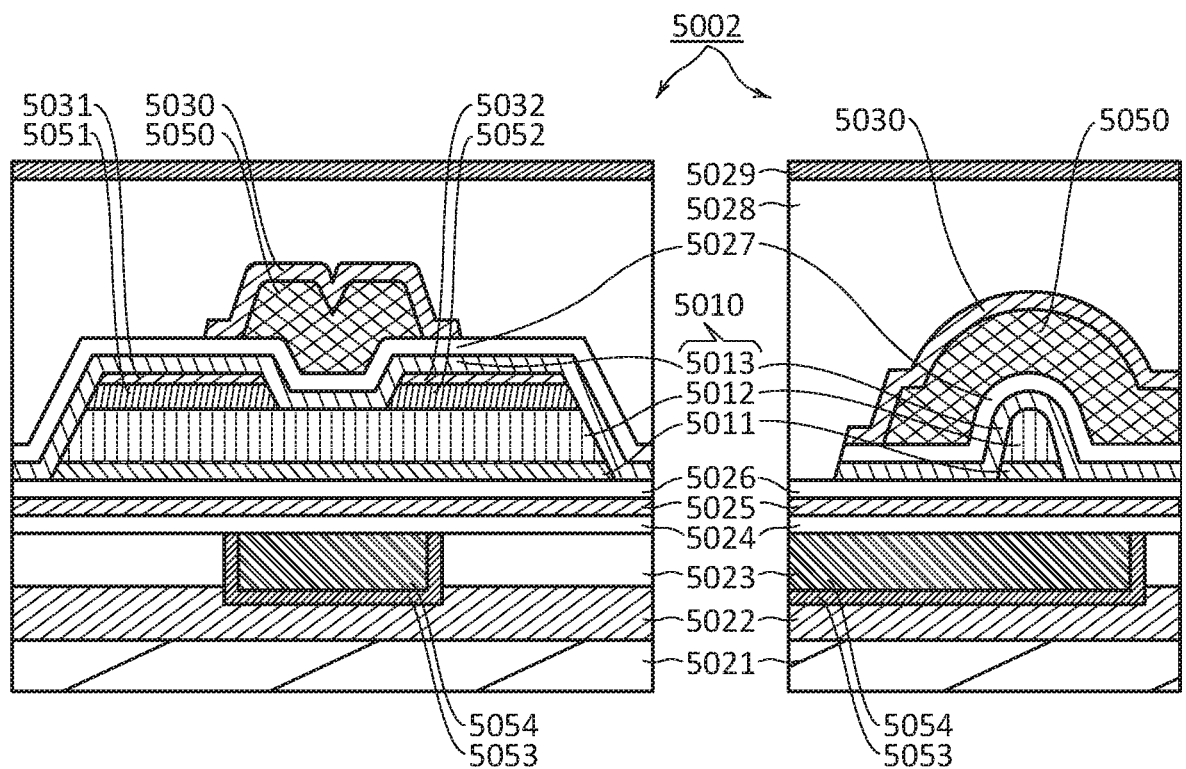

FIG. 26B illustrates a structure example of an OS transistor. The OS transistor 5002 in FIG. 26B is a modification example of the OS transistor 5001. A cross-sectional view of the OS transistor 5002 in a channel length direction is illustrated on the left drawing of FIG. 26B, and a cross-sectional view of the OS transistor 5002 in a channel width direction is illustrated on the right drawing of FIG. 26B.

In the OS transistor 5002, top and side surfaces of a stack of the metal oxide layers 5011 and 5012 are covered with a stack of the metal oxide layer 5013 and the insulating layer 5027. Thus, the OS transistor 5002 does not necessarily include the insulating layers 5031 and 5032.

<Structure Example 3 of OS Transistor>

Figure 27:
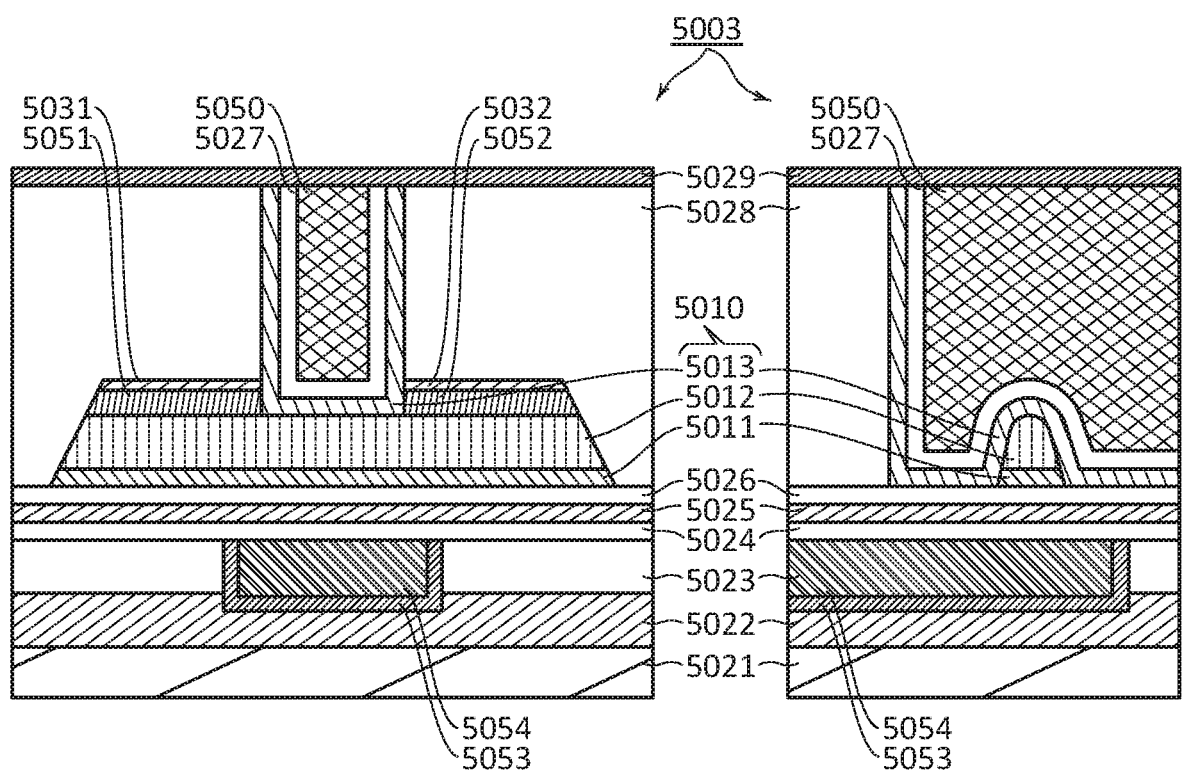
FIG. 27 is a cross-sectional view illustrating a structure example of an OS transistor.

FIG. 27 illustrates a structure example of an OS transistor. An OS transistor 5003 in FIG. 27 is a modification example of the OS transistor 5001. The OS transistor 5003 differs from the OS transistor 5001 mainly in the structure of the gate electrode. A cross-sectional view of the OS transistor 5003 in a channel length direction is illustrated on the left drawing of FIG. 27, and a cross-sectional view of the OS transistor 5003 in a channel width direction is illustrated on the right drawing of FIG. 27.

The metal oxide layer 5013, the insulating layer 5027, and the conductive layer 5050 are provided in an opening portion formed in the insulating layer 5028. In other words, a gate electrode is formed in a self-aligning manner by using the opening portion of the insulating layer 5028. Thus, in the OS transistor 5002, a gate electrode (5050) does not include a region that overlaps with a source electrode or a drain electrode (5051 or 5052) with a gate insulating layer (5017) positioned therebetween. Accordingly, gate-source parasitic capacitance and gate-drain parasitic capacitance can be reduced and frequency characteristics can be improved. Furthermore, gate electrode width can be controlled by the opening portion of the insulating layer 5028; thus, it is easy to manufacture an OS transistor with short channel length.

A channel formation region of the OS transistor preferably includes a cloud-aligned composite oxide semiconductor (CAC-OS).

The CAC-OS has a conducting function in part of a material and has an insulating function in another part of the material; as a whole, the CAC-OS functions as a semiconductor. Note that in the case where the CAC-OS is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS can have a switching function (on/off function). In the CAC-OS, separation of the functions can maximize each function.

The CAC-OS includes conductive regions and insulating regions. The conductive regions have the conducting function, and the insulating regions have the insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred in some cases.

Furthermore, in the CAC-OS, the conductive regions and the insulating regions each have a size of greater than or equal to 0.5 nm and less than or equal to 10 nm, preferably greater than or equal to 0.5 nm and less than or equal to 3 nm and are dispersed in the material in some cases.

The CAC-OS includes components having different bandgaps. For example, the CAC-OS includes a component having a wide gap due to an insulating region and a component having a narrow gap due to a conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the CAC-OS is used in a channel formation region of a transistor, high current drive capability and high field-effect mobility of the OS transistor can be obtained.

An oxide semiconductor is classified into a single crystal oxide semiconductor and a non-single-crystal oxide semiconductor according to crystallinity. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), and an amorphous-like oxide semiconductor (a-like OS).

The channel formation region of the OS transistor preferably includes a metal oxide including a crystal part, such as a CAAC-OS or an nc-OS.

The CAAC-OS has c-axis alignment, its nanocrystals are connected in the a-b plane direction, and its crystal structure has distortion. Note that distortion refers to a portion where the direction of lattice arrangement changes between a region with uniform lattice arrangement and another region with uniform lattice arrangement in a region where the nanocrystals are connected.

The shape of the nanocrystal is basically a hexagon. However, the shape is not always a regular hexagon and is a non-regular hexagon in some cases. Pentagonal lattice arrangement, heptagonal lattice arrangement, and the like are included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to the low density of arrangement of oxygen atoms in the a-b plane direction, a change in interatomic bond distance by substitution of a metal element, and the like.

The CAAC-OS tends to have a layered crystal structure (also referred to as a layered structure) in which a layer containing indium and oxygen (hereinafter referred to as an In layer) and a layer containing an element M, zinc, and oxygen (hereinafter referred to as an (M,Zn) layer) are stacked. Note that indium and the element M can be replaced with each other, and when the element M of the (M,Zn) layer is replaced with indium, the layer can also be referred to as an (In,M,Zn) layer. When indium of the In layer is replaced with the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor depending on an analysis method.

The a-like OS has a structure between those of the nc-OS and the amorphous oxide semiconductor. The a-like OS has a void or a low-density region. The a-like OS has lower crystallinity than the nc-OS and the CAAC-OS.

In this specification and the like, a CAC refers to the function or material of a metal oxide semiconductor, and a CAAC refers to the crystal structure of a metal oxide semiconductor.

REFERENCE NUMERALS 10, 11, 12, 13, 14, 40, 50, 50_T, and 50_B: cell, 18, 19, 20, 30, 31, 32, 33, 34, 35, 36, 37, 38, 42, 43, 52T, 52B, and 53: cancel circuit, 45 and 55: sense amplifier, 46 and 47: AND circuit, 47, 48, 56, and 57: analog switch, 58 and 59: OR circuit, 60, 60_T, 60_B, 61, 62, and 63: replica cell, 100 and 100R: NOSRAM, 110: control circuit, 112: row circuit, 113: column circuit, 115 and 125: memory cell array, 180, 181, 183, 190A, 190B, 190C, 191A, 191B, 191C, and 192: curve, 200: NOSRAM, 201: control circuit, 202: predecoder, 203: row circuit, 204: column circuit, 205: memory cell array, 210: row decoder, 211: word line driver, 220: column decoder, 221: leakage current cancel circuit, 222: precharge circuit, 223: sense amplifier, 224: output MUX, 225: write driver, 226: source line driver, 227: output driver, 240: circuit, 300: NOSRAM, 301: control circuit, 302: predecoder, 303: row circuit, 304: column circuit, 305: block, 306: replica cell array, 310: row decoder, 311: word line driver, 320: column decoder, 321: cancel circuit, 321: leakage current cancel circuit, 322: precharge circuit, 323: sense amplifier, 324: output MUX, 325: write driver, 326: source line driver, 329: circuit, 340: subarray, 342: macro, 351 and 352: NOSRAM, 360: control circuit, 361: predecoder, 363: logic circuit, 370: control circuit, 371: predecoder, 400: microcontroller unit (MCU), 405: bus, 410: processor core, 412: clock generation circuit, 413: power management unit (PMU), 415: peripheral circuit, 430: memory portion, 432: NOSRAM, 434: storage device, 2010: information terminal, 2011: housing, 2012: display portion, 2013: operation button, 2014: external connection port, 2015: speaker, 2016: microphone, 2051: housing, 2052: display portion, 2053: keyboard, 2054: pointing device, 2070: video camera, 2071: housing, 2072: display portion, 2073: housing, 2074: operation key, 2075: lens, 2076: joint, 2100: display device, 2101: housing, 2102: display portion, 2103: support, 2150: electric refrigerator-freezer, 2151: housing, 2152: refrigerator door, 2153: freezer door, 2170: motor vehicle, 2171: car body, 2172: wheel, 2173: dashboard, 2174: light, 5001, 5002, and 5003: OS transistor, 5010: oxide layer, 5011, 5012, and 5013: metal oxide layer, 5021, 5022, 5023, 5024, 5025, 5026, 5027, 5028, 5029, 5030, 5031, and 5032: insulating layer, 5050, 5051, 5052, 5053, and 5054: conductive layer, 5500: single crystal silicon wafer, 7000: electronic component, 7001: lead, 7002: printed circuit board, 7004: circuit board, 7110: chip, LX1, LX2, LX3, LX4, LX5, LX6, LX7, LX8, LX9, LX10, and LX11: layer, M1, M2, M3, M4, M5, M6, M7, M31, M32, M33, M34, M35, M36, M42, M43, M52, M53, MD2, MD3, MD5, MD6, MN1, MN2, MN3, MN5, MN10, MN11, MO5, MP2, MP3, MP10, and MP11: transistor, C1: capacitor, SN, QS, and QSb: node, WBL, RBL, WBL_T, RBL_T, WBL_B, and RBL_B: bit line, WWL, RWL, DRWL, WWL_T, RWL_T, DRWL_T, WWL_B, RWL_B, and DRWL_B: word line, SL, SL_T, and SL_B: source line, BGL, PL, PLDDD, PLSSS, PLDUM, PLDUM_T, and PLDUM_B: wiring, VDDD, VSSS, VBG, VCAN, VDHR, VDHW, VREF, VRBL, and VDUM: potential, Ican, I_Leak, I_D0, and I_D1: current, ADDR, ADDRi, CLK, CE, GW, BW, BURST, PRE, SEN, SEP, RSEL, GRSEL, WSEL, WSEL_T, WSEL_B, and GWSEL: signal, and RDA, WDA, DO, and DI: data.

This application is based on Japanese Patent Application Serial No. 2016-206300 filed with Japan Patent Office on Oct. 20, 2016, the entire contents of which are hereby incorporated by reference.

The invention claimed is:

1. A storage device comprising:
a gain cell;
a cancel circuit;
a write word line;
a read word line;
a write bit line; and
a read bit line,
wherein the gain cell includes a write transistor and a read transistor,
wherein the gain cell is electrically connected to the write word line, the read word line, the write bit line, and the read bit line,
wherein the cancel circuit is configured to supply, to the read bit line, current for canceling leakage current supplied to the read bit line from the gain cell in a non-selected state,
wherein the cancel circuit includes a first transistor and a second transistor,
wherein first potential is input to a first terminal of the first transistor,
wherein second potential is input to a gate of the first transistor and a gate of the second transistor,
wherein a second terminal of the first transistor is electrically connected to a first terminal of the second transistor,
wherein a second terminal of the second transistor is electrically connected to the read bit line, and
wherein a channel length of the first transistor is different from a channel length of the second transistor.

2. The storage device according to claim 1,
wherein the cancel circuit includes an inverter circuit,
wherein an output terminal of the inverter circuit is electrically connected to a gate of the first transistor, and
wherein an input terminal of the inverter circuit is electrically connected to the read bit line.

3. The storage device according to claim 1,
wherein the cancel circuit includes an inverter circuit,
wherein second potential is input to a gate of the first transistor,
wherein an output terminal of the inverter circuit is electrically connected to a gate of the second transistor, and
wherein an input terminal of the inverter circuit is electrically connected to the read bit line.

4. The storage device according to claim 1, wherein the gain cell includes a selection transistor.

5. The storage device according to claim 1, wherein a channel formation region of the write transistor includes a metal oxide.

6. A storage device comprising:
a first memory cell array;
a second memory cell array; and
a column circuit,
wherein the first memory cell array includes a first cell, a first replica cell, a first write word line, a first read word line, a first dummy read word line, a first write bit line, a first read bit line, a first wiring, and a second wiring,
wherein the first cell is electrically connected to the first write word line, the first read word line, the first dummy read word line, the first write bit line, the first read bit line, and the first wiring, wherein the second memory cell array includes a second cell, a second replica cell, a second write word line, a second read word line, a second dummy read word line, a second write bit line, a second read bit line, a third wiring, and a fourth wiring,
wherein the second cell is electrically connected to the second write word line, the second read word line, the second dummy read word line, the second write bit line, the second read bit line, and the third wiring,
wherein each of the first cell and the second cell is a gain cell including a write transistor and a read transistor,
wherein the first replica cell includes a first transistor and a second transistor,
wherein a gate of the first transistor is electrically connected to the first dummy read word line, a first terminal of the first transistor is electrically connected to the first read bit line, and a second terminal of the first transistor is electrically connected to a first terminal of the second transistor,
wherein a gate of the second transistor is electrically connected to the second wiring, and a second terminal of the second transistor is electrically connected to the first wiring,
wherein the second replica cell includes a third transistor and a fourth transistor,
wherein a gate of the third transistor is electrically connected to the second dummy read word line, a first terminal of the third transistor is electrically connected to the second read bit line, and a second terminal of the third transistor is electrically connected to a first terminal of the fourth transistor,
wherein a gate of the fourth transistor is electrically connected to the fourth wiring, and a second terminal of the fourth transistor is electrically connected to the third wiring,
wherein the first to fourth transistors and the read transistors included in the first cell and the second cell have the same conductivity type,
wherein the first write bit line, the first read bit line, the first wiring, the second write bit line, the second read bit line, and the third wiring are electrically connected to the column circuit,
wherein the column circuit includes a sense amplifier, a first cancel circuit, a second cancel circuit, a first circuit, a second circuit, a third circuit and a fourth circuit,
wherein the sense amplifier includes a first node and a second node,
wherein the first cancel circuit is configured to supply, to the first read bit line, current for canceling leakage current supplied to the first read bit line from the first cell in a non-selected state,
wherein the second cancel circuit is configured to supply, to the second read bit line, current for canceling leakage current supplied to the second read bit line from the second cell in a non-selected state,
wherein the first circuit is configured to control electrical continuity between the first read bit line and the second node,
wherein the second circuit is configured to control electrical continuity between the second read bit line and the first node,
wherein the third circuit is configured to control electrical continuity between the first write bit line and the first node, and wherein the fourth circuit is configured to control electrical continuity between the second write bit line and the second node.

7. The storage device according to claim 6, wherein the gain cell includes a selection transistor, and a capacitor.

8. The storage device according to claim 6, wherein a channel formation region of the write transistor includes a metal oxide.

9. The storage device according to claim 6,
wherein the first cancel circuit and the second cancel circuit each include a fifth transistor,
wherein first potential is input to a first terminal of the fifth transistor,
wherein second potential is input to a gate of the fifth transistor,
wherein in the first cancel circuit, a second terminal of the fifth transistor is electrically connected to the first read bit line, and
wherein in the second cancel circuit, a second terminal of the fifth transistor is electrically connected to the second read bit line.

10. The storage device according to claim 6,
wherein the first cancel circuit and the second cancel circuit each include a fifth transistor and a sixth transistor,
wherein first potential is input to a first terminal of the fifth transistor,
wherein second potential is input to a gate of the fifth transistor and a gate of the sixth transistor,
wherein a second terminal of the fifth transistor is electrically connected to a first terminal of the sixth transistor,
wherein in the first cancel circuit, a second terminal of the sixth transistor is electrically connected to the first read bit line, and
wherein in the second cancel circuit, a second terminal of the sixth transistor is electrically connected to the second read bit line.

11. The storage device according to claim 6,
wherein the first cancel circuit and the second cancel circuit each include a fifth transistor and an inverter circuit,
wherein first potential is input to a first terminal of the fifth transistor,
wherein an output terminal of the inverter circuit is electrically connected to a gate of the fifth transistor,
wherein in the first cancel circuit, a second terminal of the fifth transistor and an input terminal of the inverter circuit are electrically connected to the first read bit line, and
wherein in the second cancel circuit, a second terminal of the fifth transistor and an input terminal of the inverter circuit are electrically connected to the second read bit line.

12. The storage device according to claim 6,
wherein the first cancel circuit and the second cancel circuit each include a fifth transistor, a sixth transistor, and an inverter circuit,
wherein first potential is input to a first terminal of the fifth transistor,
wherein second potential is input to a gate of the fifth transistor,
wherein an output terminal of the inverter circuit is electrically connected to a gate of the sixth transistor,
wherein a second terminal of the fifth transistor is electrically connected to a first terminal of the sixth transistor,
wherein in the first cancel circuit, a second terminal of the fifth transistor and an input terminal of the inverter circuit are electrically connected to the first read bit line, and
wherein in the second cancel circuit, a second terminal of the sixth transistor and an input terminal of the inverter circuit are electrically connected to the second read bit line.

13. A semiconductor device comprising a memory portion including the storage device according to claim 6, the semiconductor device comprising:
a processor core; and
a bus,
wherein a signal and data are transmitted between the processor core and the memory portion through the bus.

14. The semiconductor device according to claim 13,
wherein the memory portion includes at least one of a DRAM, an SRAM, a flash memory, a ferroelectric random access memory, a magnetoresistive random access memory, a resistive random access memory, and a phase-change random access memory.

15. An electronic component comprising a chip including the storage device according to claim 1,
wherein the electronic component comprises a lead, and
wherein the lead is electrically connected to the chip.

16. An electronic component comprising a chip including the semiconductor device according to claim 13,
wherein the electronic component comprises a lead, and
wherein the lead is electrically connected to the chip.

17. An electronic device comprising the electronic component according to claim 16, the electronic device comprising:
at least one of a display portion, a touch sensor, a microphone, a speaker, an operation key, and a housing.

18. A method for operating the storage device according to claim 6, comprising the steps of:
establishing electrical continuity between the first read bit line and the second node by the first circuit and establishing electrical continuity between the second read bit line and the first node by the first circuit while the sense amplifier is not in an active state,
turning on the write transistor included in the first cell by selecting the first read word line,
turning on the write transistor included in the second cell by selecting the second dummy read word line,
activating the sense amplifier, and
outputting potential of the second node of the sense amplifier in the active state.

19. A storage device comprising:
a gain cell;
a cancel circuit;
a write word line;
a read word line;
a write bit line; and
a read bit line,
wherein the gain cell includes a write transistor and a read transistor,
wherein the gain cell is electrically connected to the write word line, the read word line, the write bit line, and the read bit line,
wherein the cancel circuit is configured to supply, to the read bit line, current for canceling leakage current supplied to the read bit line from the gain cell in a non-selected state,
wherein the cancel circuit includes a first transistor and second transistor, wherein first potential is input to a first terminal of the first transistor, wherein second potential is input to a gate of the first transistor and a gate of the second transistor, wherein a second terminal of the first transistor is electrically connected to the read bit line via the second transistor, wherein a channel length of the first transistor is different from a channel length of the second transistor, and wherein a current drive capability of the first transistor is lower than a current drive capability of the read transistor.

\* \* \* \* \*